(12) United States Patent
MacElwee et al.

(10) Patent No.: US 7,923,925 B2
(45) Date of Patent: Apr. 12, 2011

(54) LIGHT EMITTING DEVICE WITH A STOPPER LAYER STRUCTURE

(75) Inventors: Thomas MacElwee, Nepean (CA); Jean-Paul Noel, Ottawa (CA); Dean Ducharme, Ottawa (CA); Yongbao Xin, Ottawa (CA)

(73) Assignee: Group IV Semiconductor, Inc., Ottawa, Ontario (CA)

( * ) Notice: Subject to any disclaimer, the term of this patent is extended or adjusted under 35 U.S.C. 154(b) by 154 days.

(21) Appl. No.: 12/273,972

(22) Filed: Nov. 19, 2008

(65) Prior Publication Data

US 2009/0128029 A1     May 21, 2009

Related U.S. Application Data

(60) Provisional application No. 60/989,227, filed on Nov. 20, 2007, provisional application No. 61/084,686, filed on Jul. 30, 2008.

(51) Int. Cl.
*H01J 1/62* (2006.01)
*H01J 63/04* (2006.01)

(52) U.S. Cl. ......... 313/506; 313/498; 313/503; 313/512

(58) Field of Classification Search .......... 313/498–512; 428/690, 917
See application file for complete search history.

(56) References Cited

U.S. PATENT DOCUMENTS

| | | | |
|---|---|---|---|
| 4,613,882 A | 9/1986 | Pimbley et al. | 357/23.3 |
| 5,229,628 A | 7/1993 | Kobayashi et al. | 257/103 |
| 2003/0189403 A1* | 10/2003 | Yamada et al. | 313/511 |
| 2004/0051111 A1* | 3/2004 | Ota et al. | 257/98 |
| 2006/0244373 A1* | 11/2006 | Nomura et al. | 313/506 |
| 2007/0046189 A1* | 3/2007 | Hatwar et al. | 313/506 |
| 2007/0181898 A1 | 8/2007 | Chik et al. | 257/99 |
| 2008/0048558 A1* | 2/2008 | Song et al. | 313/504 |
| 2008/0093608 A1* | 4/2008 | Chik et al. | 257/89 |
| 2008/0122345 A1* | 5/2008 | Sakata et al. | 313/504 |

(Continued)

FOREIGN PATENT DOCUMENTS

JP     2007042624 A   *   2/2007

(Continued)

OTHER PUBLICATIONS

U.S. Appl. No. 61/084,666, filed Jul. 30, 2008 entitled "Injector Layer for Electrode of Light Emitting Devices" by MacElwee.
U.S. Appl. No. 61/083,673, filed Jul. 25, 2008 entitled "Injector Layer Structure for a Light Emitting Device" by Tarof et al.
He et al "Damage study of ITO under high electric field", Thin Solid Films 363 (2000) pp. 240-243.

(Continued)

*Primary Examiner* — Joseph L Williams
*Assistant Examiner* — Kevin Quarterman
(74) *Attorney, Agent, or Firm* — Teitelbaum & MacLean; Neil Teitelbaum; Doug MacLean

(57) ABSTRACT

Electroluminescent (EL) devices structures are provided comprising a hot electron stopper layer structure to capture hot electrons and dissipate their energy, thereby reducing damage to the transparent conducting oxide (TCO) layer and reducing other hot electron effects, such as charging effects, which impact reliability of EL device structures. The stopper layer structure may comprise a single layer or multiple layers provided between the TCO electrode layer and the emitter structure, and may also function to reduce diffusion or chemical interactions between the TCO and the emitter layer structure. Optionally, stopper layers may also be provided within the emitter structure. Suitable stopper layer materials are wideband gap semiconductors or dielectrics, preferably transparent at wavelengths emitted by the EL device characterized by high impact ionization rates, and/or high relative permittivity relative to adjacent layers of the emitter structure.

25 Claims, 12 Drawing Sheets

U.S. PATENT DOCUMENTS

| | | | |
|---|---|---|---|
| 2008/0136320 A1* | 6/2008 | Choi | 313/504 |
| 2008/0169752 A1* | 7/2008 | Hattori et al. | 313/503 |
| 2008/0246046 A1 | 10/2008 | Chik et al. | 257/98 |
| 2008/0303415 A1* | 12/2008 | Suzuri et al. | 313/504 |
| 2009/0001877 A1* | 1/2009 | Park et al. | 313/504 |
| 2009/0206732 A1* | 8/2009 | Seo et al. | 313/504 |

FOREIGN PATENT DOCUMENTS

| | | |
|---|---|---|
| WO | 01/31979 | 5/2001 |

OTHER PUBLICATIONS

J. Sun et al., "Bright Green electroluminescence from $Tb^{3+}$ in silicon metal-oxide-semiconductor devices" J. Appl. Phys. 97, 123513 (2005).

James Kolodzey et al., "Electrical Conduction and Dielectric Breakdown in Aluminum Oxide Insulators on Silicon", IEEE Trans. Electron Device 47, 121-127 (2000).

S.M. Sze, "Physics of Semiconductor Devices", p. 850-852 Wiley-Interscience, New York.

* cited by examiner

LIGHT EMITTING DEVICE WITH A STOPPER LAYER STRUCTURE

CROSS-REFERENCE TO RELATED APPLICATIONS

This application claims priority from U.S. provisional patent application No. 60/989,227 filed 20 Nov. 2007 and U.S. provisional patent application No. 61/084,686 filed 30 Jul. 2008, both of which are incorporated herein by reference for all purposes.

TECHNICAL FIELD

This invention relates to light emitting devices, and more particularly to improvements in electroluminescent device structures relating to reducing hot electron related effects, such as charging effects, and improving charge to breakdown and reliability of TCO electrode structures, with particular application for light emitters for solid state lighting.

BACKGROUND ART

The generation of light from electroluminescent solid state light emitting devices (EL devices), as described in this application, is based on applying energy from an electric field to a light emitting structure including an active region or emissive layer. The emissive layer may comprise a wide band gap semiconductor or dielectric e.g. silicon nitride, silicon dioxide, or GaN, which may include luminescent centres, such as nanocrystals and/or rare earth species. It is important to deliver a minimum and controlled amount of energy to luminescent centres in an active light emitting layer in the device. If the energy of incident electrons is too low there will be no light emission possible. On the other hand, if the electrons possess too much energy there will be light emission but excess energy will be carried away in the form of heat, which reduces efficiency. Furthermore, hot electrons can be responsible for damage to the host matrix, result in charging, and ultimately contribute to breakdown and failure of the device under bias.

For example, as described in pending United States Patent Publication No. 2008/0093608 filed Dec. 12, 2006, entitled "Engineered structure for solid state light emitters", a device is described comprising a light emitting structure having a plurality of emissive layers, i.e. optically active layers comprising luminescent centres, that are separated by drift layers. The light emitting structure is disposed between electrodes for applying an electric field to the light emitting structure. One electrode, usually a top electrode, comprises a transparent conductive oxide (TCO), typically a layer of indium tin oxide (ITO) or other suitable transparent conductive material, which not only provides for electron injection, but also allows light to be extracted from the EL device. Electrons are accelerated and gain energy from an applied electric field as they traverse each drift layer, and energy is released as light from luminescent centres in the active layer by impact ionisation or impact excitation. The drift layers may alternatively be referred to as drift regions, buffer layers or acceleration layers.

In the ballistic regime, the kinetic energy in electron volts gained by an electron passing through the drift region is E×d where E is the electric field across a drift layer in V/cm and d is the thickness of the drift layer in cm. Thus, as described in United States Patent Publication No. 2008/0093608, by selecting the appropriate thickness of drift layer, matched to an excitation energy of the active layer, electrons gain the necessary energy to excite the emissive layer. Careful consideration and design of the drift layer in conjunction with the operating electric field allows tuning of the electron energy with the drift layer thickness. The drift layers may be made from a wide bandgap semiconductor or dielectric material, such as oxides or nitrides of silicon. The structure may be deposited by techniques such as CVD (chemical vapour deposition), PECVD (plasma enhanced CVD), sputtering, ALE (atomic layer epitaxy) and MBE (molecular beam epitaxy).

The TCO electrode has a critical role in the performance of an electroluminescent device of this type. Indium tin oxide (ITO) is the most commonly used TCO. There are many other known TCOs, e.g. binary and ternary compounds such as ZnO and $SnO_2$, which are being explored as an alternative to ITO for EL devices. Some other binary compounds of particular interest as alternative to ITO are aluminum doped ZnO (AZO), indium doped ZnO (IZO), and $TiO_2$ [anatase] doped with Ta or Nb. However, use of these compounds is currently less established in the industry, and it has yet to be demonstrated that they can match the electrical properties of ITO.

Although TCOs, such as ITO, have been found to tolerate high currents at low fields, TCOs in EL devices have a tendency to fail when they are simultaneously exposed to large electric fields and high electron fluxes. These conditions may be encountered, for example, in operating devices under conditions to maximize light emission for application to solid state lighting, where high brightness is required.

As an example, during testing of a EL device structure in which the emissive layer comprises a silicon rich silicon oxide layer containing silicon nanoparticles, and the drift layer comprises silicon dioxide, the structure was found to suffer from charging effects that resulted in the device becoming unstable and ultimately led to breakdown of the device under bias. It is believed that hot electrons are responsible for damage and for charging effects observed in the structure when biased at a constant current density.

While observing the spectrum of emission from a device comprising an ITO top electrode during failure, as shown in FIG. 1, two very bright lines appeared at 452 nm and 410 nm. These lines have been identified as originating from singly ionized Sn and In respectively (NIST Atomic Spectra Database). This suggests that the ITO is dissociating as the bias, electric field and electron flux are increased, and the damage threshold of the ITO is exceeded. In fact, He et al ("Damage study of ITO under high electric field", Thin Solid Films, 363 (2000) pp. 240-243) have shown that exposure of ITO to large electric fields greater than 1 MV/cm can result in decomposition of ITO and the physical migration of In and Sn within the film. Energies associated with the In peak suggest that there are electrons with energies greater than 3 eV impinging on the ITO contact layer. Similar spectra have been observed from AZO failure in similar devices under bias.

One way to reduce the probability of hot electrons passing unobstructed through the emissive layer is to ensure the density of optical centres is high enough that the electron capture cross section of the luminescent centres in the active layer makes the layer effectively opaque to incident electrons. The electron capture cross section depends on the particular optical/emissive centre(s) used, and thus the required density, or concentration, of optical centres is dependent on the species and its capture cross section. When the optical centres are rare earth ions, such as terbium, it is known that higher concentrations (e.g. densities of greater than ~4% for Tb, or less for other rare earth species) give rise to quenching of optical centres due to cross relaxation and clustering effects (J. Sun et al., J. Appl. Phys. 97, 123513 (2005)). Thus there may be practical limits to increasing the density of optical centres in thin layers. Another alternative is to increase the thickness of the emissive layers to make the layer sufficiently opaque to electrons. However, this solution would require additional voltage to bias and support the electric field in these regions. This would have a negative effect on the efficiency of such a device as the applied voltage is directly related to the input power, and may be undesirable for other reasons.

Copending United States Patent Publication No. 2007/0181898 and United States Patent Publication No. 2008/0246046 disclose the use of a thin, conductive transition layer between the emitter structure and the top and bottom contact electrodes, e.g. to control current injection. As described, this layer may also help to reduce hot electron effects and provide shielding to the current injection layer. A conducting layer (metallic or silicon-rich silicon oxide) must be thin, because it is generally opaque to the transmission of light. Thus, a thin conductive layer has only limited ability to shield the TCO layer from hot electrons, without impeding light extraction.

There is, therefore, a need for alternative solutions to reduce deleterious hot electron effects, such as charging, damage, or other effects leading to breakdown, and/or decomposition of TCO electrode materials, or similar hot electron effects within the emitter layer structure.

Consequently, the present invention seeks to overcome or mitigate the above mentioned problems, or at least provide an alternative.

DISCLOSURE OF INVENTION

To this end, a stopper layer structure is provided to capture hot electrons and dissipate their energy, reduce damage to the TCO layer and reduce other hot electron effects, such as charging effects, which impact reliability of EL device structures. The stopper layer structure, comprising one or more layers, may be provided between the TCO electrode layer and the emitter structure. The stopper layer structure may also function to reduce diffusion or chemical interactions between the TCO and the emitter layer structure. A stopper layer structure may alternatively or additionally be provided within the emitter structure of a light emitting device.

Thus one aspect of the present invention provides a light emitting structure comprising:

an electroluminescent emitter layer structure (EL structure) (20) comprising at least one active layer (12,14) containing luminescent centers and a respective drift layer (13, 15) adjacent each active layer, first and second electrode layers (25,21) disposed on opposite sides of the electroluminescent emitter layer structure for applying an electric field thereto for excitation of light emission from the luminescent centers; and at least one stopper layer (40,16) for dissipating hot electron energy (40 disposed between layers of the EL structure and one of the first and second electrode layers and. wherein the at least one stopper layer (40,16) is selected from the group consisting semiconductors and dielectrics having at least one of an impact ionization rate and a relative dielectric permittivity greater than that of adjacent layers of the EL structure.

The stopper layer structure may comprise one or more layers of suitable materials that are selected based on their ability to "cool" hot electrons. That is, a material that causes hot electrons to dissipate kinetic energy to the stopper layer structure by a process such as impact ionization or impact excitation.

Accordingly, the at least one stopper layer (40,16) is preferably selected from the group consisting semiconductors and dielectrics having at least one of an impact ionization rate and a relative dielectric permittivity greater than that of adjacent layers of the EL structure.

Suitable materials for the stopper layer (i.e. hot electron cooling layer) are transparent, i.e. have low attenuation, to wavelengths emitted by the EL device, and have other suitable properties, including high breakdown strength, appropriate relative dielectric permittivity. Materials should be otherwise compatible with other materials of the EL device structure, and capable of being deposited using processes compatible with other fabrication steps required for other layers or structures of the respective EL device technology.

In a device operated with DC bias, and forward biased to cause electrons to travel from a N+ substrate towards the to TCO electrode, a hot electron stopper layer structure provided between the emitter structure and the TCO electrode effectively disperses hot electron energy to reduce hot electron damage and charging effects which may contribute to TCO breakdown.

In an AC powered device, a stopper layer structure is similarly located is between the TCO electrode and the emitter structure to protect the TCO electrode from hot electrons. Optionally, a second stopper layer may be provided between the emitter structure and the bottom electrode.

In preferred embodiments, a light emitting device comprises an EL emitter structure having a multilayer structure comprising at least one layer pair comprising an emissive layer and a drift layer, disposed between the electrodes. In some preferred embodiments the emitter layer structure comprises a plurality of emissive layers and respective drift layers, and the electron stopper layer is disposed at the interface between the TCO layer and the emitter structure, i.e. between the TCO electrode and a top (drift or active) layer of the emitter layer structure.

Preferably, the electron stopper layer structure comprises a material characterized by a high relative permittivity with respect to the adjacent drift layer, or top layer of the emitter structure, a suitable bandgap for transmitting light at wavelengths emitted by the EL device, high breakdown strength, and high impact ionization rates so that the thickness of the stopper layer may be relatively thin.

For example, for an EL device wherein the active emissive layers are rare earth (RE) doped silicon dioxide, and drift layers are silicon dioxide layers of an appropriate thickness, the stopper layer structure may preferably comprise a single layer of silicon nitride between the emitter structure and the TCO electrode. The layer of silicon nitride is preferably high quality CVD nitride. In some applications a layer of high quality silicon dioxide may be acceptable, however silicon nitride is preferred. Another option is to use high quality silicon dioxide doped with a rare earth (such as cerium) with a very high electron absorption cross section; sufficient stopping is provided as long as the atomic concentration is several times greater than the inverse of the product of the layer thickness and the cross section. Depending on compatibility with other layers of the EL device, other preferred materials for a stopper layer may include one or more of thin film diamond, silicon carbide or gallium nitride, all which have high impact ionization rates and suitable bandgap for transmission of visible light; or aluminum oxide, which has a high relative permittivity. Silicon could also be acceptable if it is sufficiently thin, such that it absorbs little light (preferably less than 5%). Such materials would also be suitable for EL devices comprising active layers comprising SRSO or SRSN, i.e. based on luminescent centres comprising nano-crystals with or without rare earth doping, and silicon oxide or silicon nitride drift layers.

Alternatively the stopper layer structure may comprise a dual or multilayer structure, e.g. first and second barrier layers, at the interface between the emitter structure and the TCO electrode. Materials for such a multilayer structure may also provide an effective chemical diffusion barrier. For example, one layer may be selected to stop hot electrons as described above, and a second barrier layer may be selected to be electrically conductive and chemically inert, or to assist with electron injection. For an emitter structure as mentioned above comprising RE doped silicon dioxide emissive layers and silicon dioxide drift layers, a preferred embodiment of a multilayer stopper layer structure comprises a barrier layer of a refractory metal nitride adjacent the TCO layer, a second barrier layer adjacent the emitter structure, comprising a material which is inert with respect to the emitter structure, e.g. silicon nitride, which also functions as an electron stopper layer, and for practical reasons, an adhesion layer, e.g. a thin layer of the refractory metal, therebetween. Such a layer simultaneously improves both forward and reverse IV characteristics of the light emitting device to enable operation at higher current densities.

In other preferred embodiments, the stopper layer structure comprises one or more stopper layers within the emitter structure. For example, the stopper layer structure may comprise a stopper layer adjacent each emissive layer in the emitter structure in a DC operated device. That is, each emitter layer is disposed between a respective drift layer and a stopper layer. In operation, primary electrons and carriers generated by impact ionisation will increase the conductivity of the stopper layers and result in a voltage drop across the individual stopper layer structure and an increase in power efficiency of the device structure. Once cooled, an electron is once again accelerated in the electric field in the next drift layer. Alternatively, in an AC operated device, the stopper layer structure may comprise a stopper layer sandwiched between two emissive layers, so as to limit hot electron travel in each direction, under forward or reverse bias.

The requirements for stopper layers located within the emitter structure are similar to those for a stopper layer structure adjacent the TCO electrode. Suitable materials for a hot electron stopper layer within the emitter layer structure must provide for hot electrons to lose their energy through an appropriate process, e.g. by impact ionization, i.e. the incident hot electron collides with the lattice of stopper layer material and created an electron hole pair, thereby losing kinetic energy to the stopper layer material. Materials with high impact ionization rates allow for the stopper layer to be made as thin as possible. The material must be otherwise compatible with operation of the EL device. For example, a thin 10 nm layer of silicon provides an effective stopper layer adjacent an emitter layer for DC operation, or within the emitter layer (i.e. sandwiched between two active layers) for AC operation. However, because silicon has some absorption in the visible region, a thin film of diamond, silicon carbide or gallium nitride or other material having a suitable band gap in the visible region may be preferred. The stopper layer may also comprise rare earth (preferably cerium) doped silicon dioxide.

In each of the preferred embodiments, suitable materials for stopper layer structures should be transparent (i.e. have low attenuation) at wavelengths to be emitted from the device. That is, for visible wavelengths, the material exhibits a large band gap greater than 3 eV, for example in the range 3 eV to 5 eV, to ensure low loss transmission of visible light.

The relative permittivity should be higher than that of the drift layer to ensure a reduction of the applied electric field. Beneficially, the relative dielectric permittivity is greater than 3.5 and preferably greater than 7.

The breakdown field strength is desirably above 4 MV/cm and preferably greater than 6 MV/cm, i.e. dependent on the operating requirements of the device. This typically requires deposition of the one or more stopper layers by a process that provides a high quality, stoichiometric layer, with low trap density.

Embodiments of the invention will now be described, by way of example, with reference to the following drawings.

BRIEF DESCRIPTION OF THE DRAWINGS

FIG. 4 shows a schematic representation of an electroluminescent device structure comprising a stopper layer structure according to a first embodiment of the present invention and FIG. 4A shows an alternative embodiment;

FIGS. 6, 6A, and 6B shows a schematic representation of an electroluminescent device structure comprising a stopper layer structure within the emitter structure according to the third and fourth embodiments of the present invention;

DETAILED DESCRIPTION OF PREFERRED EMBODIMENTS

Figure 1:
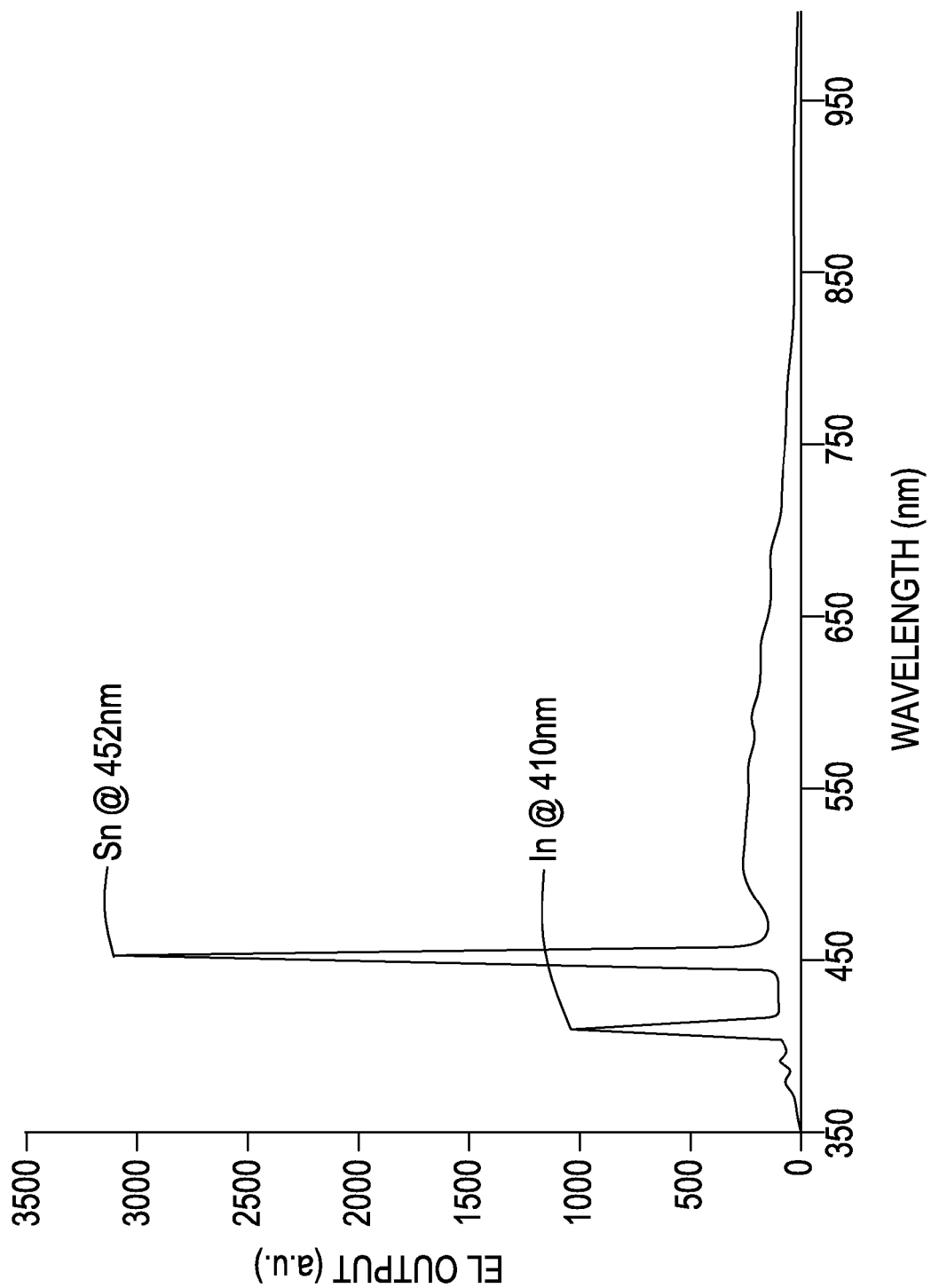
FIG. 1 shows an emission spectrum of a device having a TCO electrode comprising ITO, observed to be failing while under bias.
Figures 2, 2A:
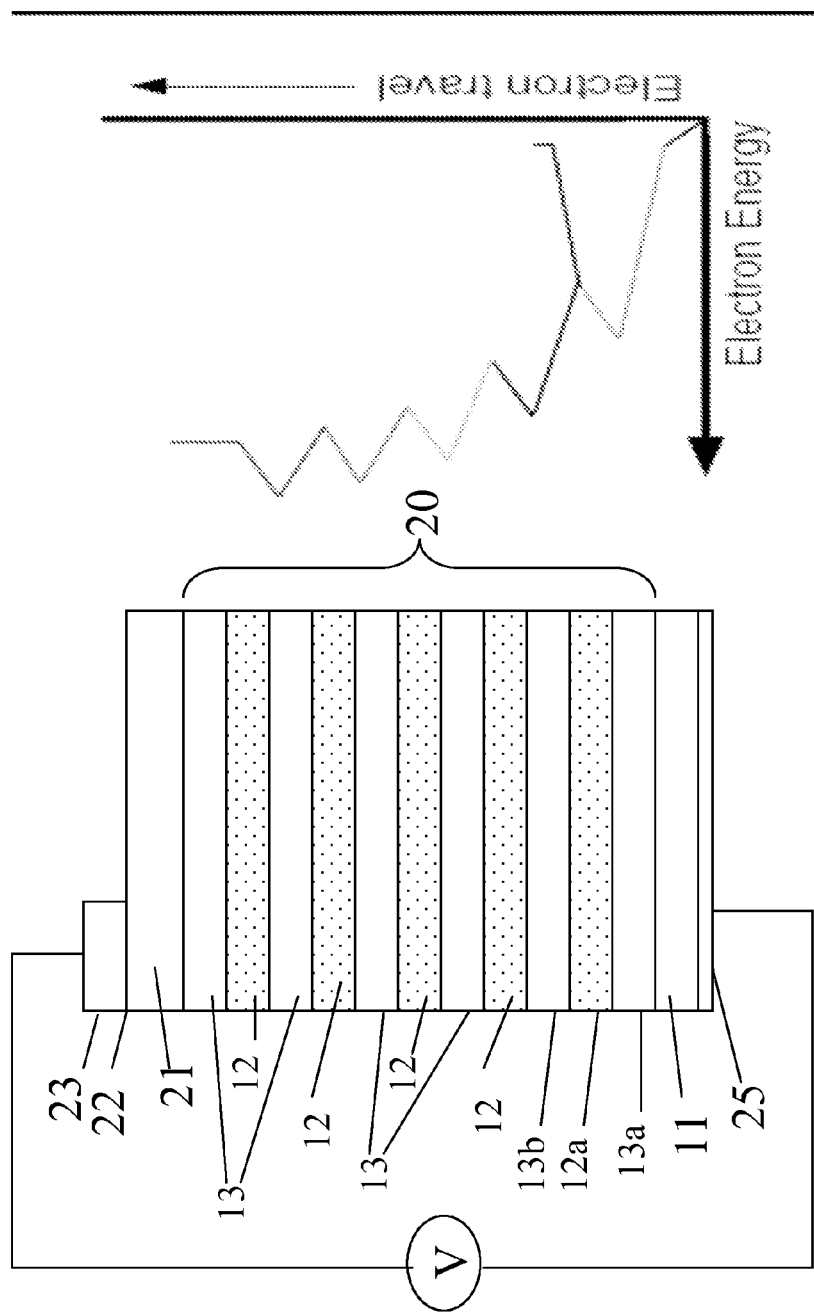
FIG. 2 shows a schematic representation of an electroluminescent device comprising a multilayer emitter structure.
FIG. 2A shows electron energy as a function of electron travel.

A simplified schematic of elements of an electroluminescent device structure, similar to that described in copending United States Patent Publication No. 2008/0093608, are shown in FIG. 2. The light emitting device 10 comprises an electroluminescent emitter structure 20 disposed between electrode layers 21 and 25 for a applying an electric field to the emitter structure 20 (EL structure) for exciting luminescent centres. The EL structure 20 comprises a multilayer stack of at least one layer pair, and typically a plurality of layer pairs 22 each comprising an emissive (i.e. active) layer 12 and a corresponding drift (i.e. buffer) layer 13 adjacent the respective active layer 12, formed on a substrate 11. The emissive layers 12 comprise a concentration of luminescent centres, for example rare earth species and/or semiconductor nanoparticles, within a host matrix of a wideband gap semiconductor material or dielectric, for emitting light at a desired wavelength or range of wavelengths. The drift layers 13 comprises a wide band gap semiconductor or a dielectric material, and are of a specific thickness related to an excitation energy e of the emissive layers 12, so that electrons traversing a drift layer in an applied electric field gain sufficient energy from the electric field to excite the respective emissive layer 12 to emit light at the appropriate wavelength. Preferably, the kinetic energy in electron volts gained by an electron passing through the drift region is E×d where E is the electric field across a drift layer in V/cm and d is the thickness of each drift layer 13 is matched to a desired excitation energy e of the respective emissive layer 12 (i.e. E×d≧e). As described in the above mentioned patent application, the emitter structure 20 may comprise a plurality of layer pairs, in which all active layers 12 may emit light of the same wavelength. Alternatively, individual active layers 12 or groups or sets of active layers 12 may each emit light at a plurality of different wavelengths, which are combined to provide visible light having a desired spectrum, or CRI. The composition and thickness of each active layer 12 and each respective drift layer 13 is selected accordingly (although for simplicity in the schematics shown in FIG. 2 and other figures, the layers may be shown schematically with similar thicknesses).

Referring to FIGS. 2 and 2A, the source of hot electrons can be explained. Analysis of device performance indicated that only a small percentage (~1%) of incident electrons were being used effectively and transferring their energy to the optical centres (i.e. luminescent centres) in the emissive layers. In a device having an N+ substrate and operated with a DC bias as illustrated in FIG. 2, electrons gain energy from the applied electric field in the first drift layer 13a as they travel from the N+ substrate 11 towards the top TCO electrode 21. As electrons pass through the next emissive layer 12a, a small percentage of electrons will interact with optical centres and cause light emission, but other electrons will miss optical centres in this layer 12a and therefore lose very little energy, and as they enter a second drift layer 13b, they will continue to gain additional energy from the electric field. This results in a cascade of energy gain as electrons pass through subsequent drift layers in a multilayer structure as shown schematically in FIG. 2A. Hot electrons will quickly acquire enough energy to damage the drift or emissive regions leading to the observed charging and ultimately failure of the device under bias. Some electrons may have gained energies in excess of 3 eV on reaching the TCO electrode layer 21. As mentioned above, hot electrons may lead to deleterious effects such as charging, or breakdown within layers of emitter structure, or breakdown and decomposition of the TCO layer. In order to overcome the issue of damage and disassociation of the TCO from hot electrons, some means of cooling the incident electrons and reducing the electric field is required.

Figure 3:
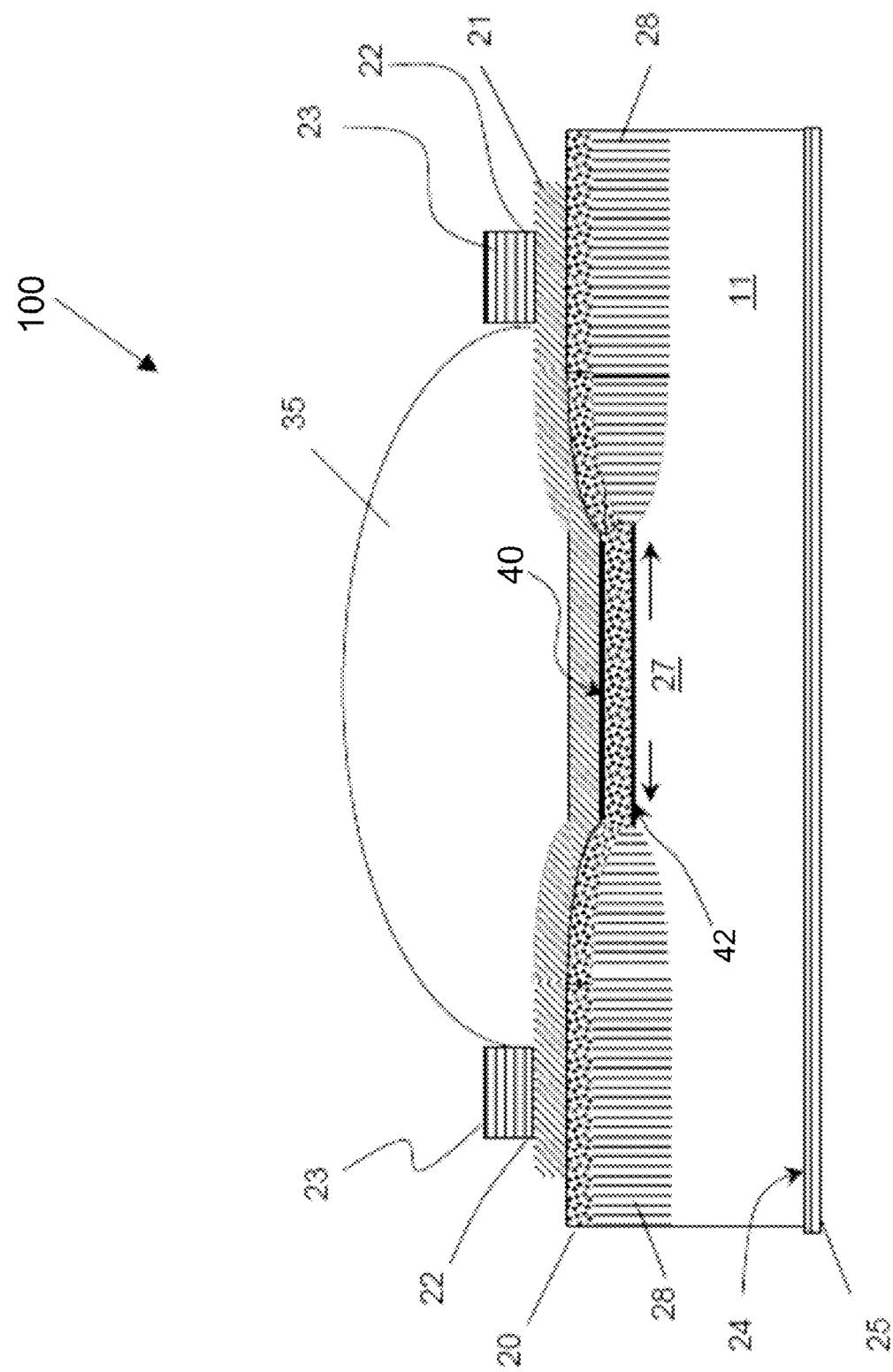
FIG. 3 shows a schematic representation of an electroluminescent device structure according to an embodiment of the present invention.

A light emitting device structure 100 comprising a stopper layer structure, according to embodiments of the present invention, may be embodied as a device structure such as that shown schematically in FIG. 3. The light emitting device structure 100 comprises a substrate 11, which is typically N-type or P-type silicon, or other suitable conductive layer on a substrate of arbitrary conductivity to which electrical connections may be made. Thick field oxide (FOX) regions 28 are formed on the substrate 11 to define a device well region 27. The electroluminescent emitter layer structure (EL structure) 20 is deposited thereon, and a layer of a transparent conductive oxide (TCO layer) 21 formed thereon. Top contacts 23 to the TCO layer 21 are provide over the field oxide regions 28, that is a barrier layer 22 is provided on top of the TCO layer 21 and contacts 23 are defined thereon in a region over the field oxide regions. Contacts 23 are placed on top of the field oxide regions 28 so as not to block light emission from the emitter structure 20. Also, the FOX regions 28 provide a barrier to vertical current flow and confine current flow to the device well region 27. Thus the optically active region of the emitter structure 20 is confined within the device well region 27 between the FOX regions 28.

In some embodiments of the present invention, a stopper layer structure 40 is provided between the emitter structure 20, and the TCO electrode 21, as will be described in more detail below. Optionally layer 42 may be provided between the emitter structure 20 and the substrate 11, as will also be described below. An encapsulant 35 is provided having a refractive index closely matched to the refractive index of the underlying device structure. The encapsulant 35 reduces total internal reflections at the emitter layer structure/encapsulant interface and improves the light extraction efficiency of the device 100. The encapsulant layer 35 preferably has a domed or curved upper surface to provide a lensing function. A back reflector 42 may also be provided between the substrate 11 and the emitter structure 20 or between the substrate 11 and a bottom contact 25 (layer 24) to reflect light generated within the emitter structure 20 back through the transparent upper electrode 21.

In exemplary embodiments to be described below, the active layers 12 (or 14) may comprise rare earth (RE) doped silicon dioxide, alumina or other host material, or alternatively silicon rich silicon oxide (SRSO) or silicon rich silicon nitride (SRSN) comprising silicon nanocrystals, with or without RE doping. Corresponding drift layers 13 (or 15) may comprise an appropriate thickness of silicon dioxide, or silicon nitride or other suitable wideband gap semiconductor or dielectric.

Figure 4:
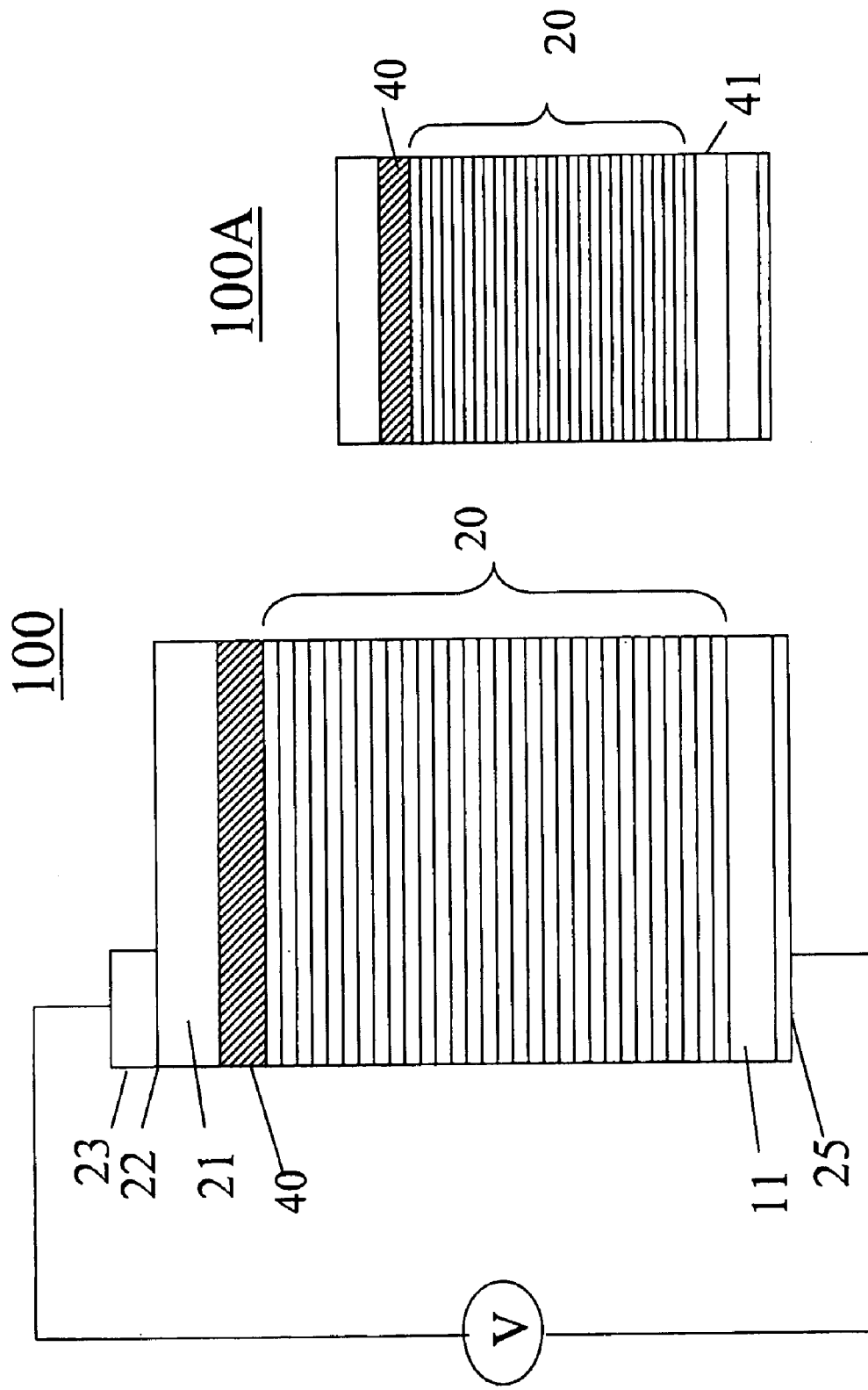

A simplified schematic of elements of the device 100 of FIG. 3 is shown in FIG. 4 and comprises the EL structure (emitter structure) 20 and the stopper layer structure 40 according to a first embodiment of the present invention. The device structure 100 is similar to that shown in FIG. 2, except that the electron stopper layer structure 40 is provided between the top layer of the emitter structure 20 and the TCO electrode 21. The hot electron stopper layer structure 40 functions to capture hot electrons and dissipate their energy, thereby reducing damage to the TCO layer and reducing other hot electron effects, such as charging effects which impact reliability of EL device structures. In selecting materials for a stopper layer structure 40, the stopper layer structure 40 should not significantly impede the injection or collection of electrons by the TCO electrode 21.

In a EL device 100 operated with DC bias, as shown in FIG. 4, when the TCO electrode 21 is biased positively with respect to the N+ substrate 11, a hot electron stopper layer structure 40 is disposed between the emitter structure 20 and the TCO electrode 21 and effectively disperses hot electron energy to reduce hot electron damage and charging effects which contributed to TCO breakdown and other deleterious effects.

In a EL device 100A operated with AC bias, a stopper layer structure comprising a layer 40 is similarly located is between the TCO electrode 21 and the emitter structure 20 to protect the top TCO electrode 21 from hot electrons. Optionally the stopper layer structure 40 may comprise a another stopper layer 41, similar to layer 40 provided between the emitter structure 20 and the substrate 11 or bottom electrode 25, as shown in FIG. 4A This optional stopper layer 41 is not as necessary to stop hot electrons at the bottom electrode, but it does ensure that the structure providing electrical injection is more symmetric with respect to the upper and lower electrodes 21 and 25. The stopper layer 41 may be obviated if alternatively a transition layer or back reflector 42 is provided between the emitter layer structure 20 and the substrate 11 or bottom electrode 25 as shown in FIG. 3.

The stopper layer structure 40 may comprise a single layer as shown schematically in FIG. 4 or may alternatively comprise a plurality of layers, as described in more detail with reference to other embodiments.

The stopper layer structure 40 comprises one or more layers of suitable materials which are selected based on their ability to "cool", or de-energize, energetic hot electrons, i.e. a material that causes hot electrons to dissipate kinetic energy to the stopper layer structures 40 by a process such as impact ionization or impact excitation. Suitable materials are transparent, i.e. have low attenuation, to wavelengths emitted by the EL device, and should otherwise be compatible with other materials of the EL device structure 100. Preferred materials have suitable electrical properties including high breakdown strength, high impaction ionization rates, and appropriate relative dielectric permittivity with respect to the active layers 12 and/or drift layers 13 used in the EL device 100.

Figure 12:
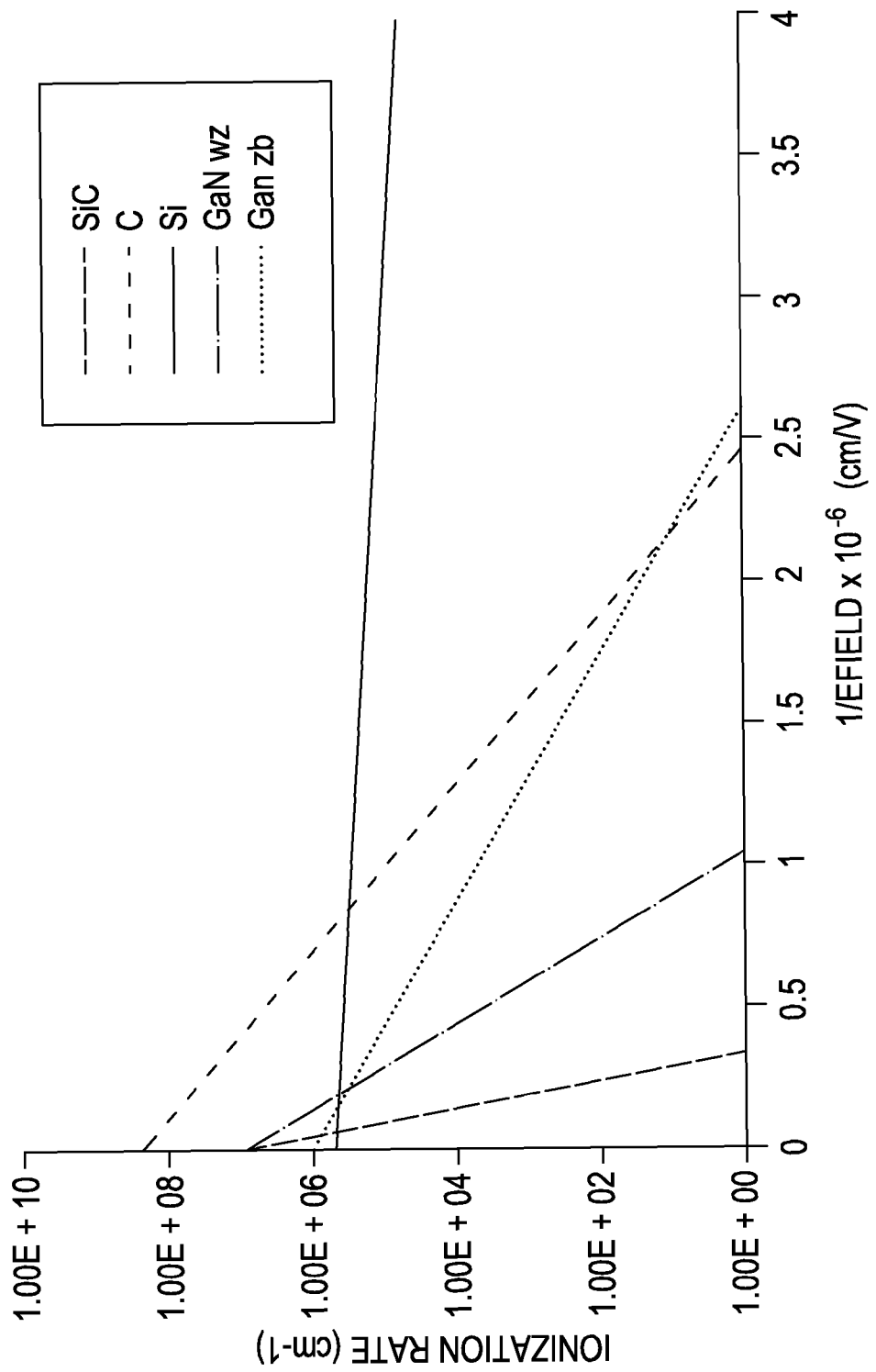
FIG. 12 shows a plot of impact ionization rates for various semiconductors as function of inverse electric field.

In considering materials suitable for use as ain the hot electron stopper layer 40 (or electron cooling layer) as shown in FIG. 4 several materials having high impact ionization rates were investigated. For example, FIG. 12 shows a plot of the impact ionization rates for various semiconductors vs. inverse electric field. Diamond is a particularly attractive semiconductor for consideration as a stopper layer because of its high impact ionization rate relative to other semiconductors such as silicon or gallium nitride.

Since constituents of ITO and other binary and ternary TCO materials have relative low melting points (e.g. 156° C. and 232° C. respectively for In and Sn) apart from hot electron effects, any driving force, including chemical effects, that may lead to phase separation and contribute to diffusion and resulting contact degradation during operation. Consequently, it may also beneficial to select a material for the stopper layer structures 40 to provide a chemical barrier between the TCO electrode layer 21 and layers of the underlying emitter structure 20. In this case, it is desirable that the material in contact with the TCO 21 is chemically inert with respect to the TCO 21 and has relatively low diffusion coefficients for constituents of the TCO 21.

Figure 11:
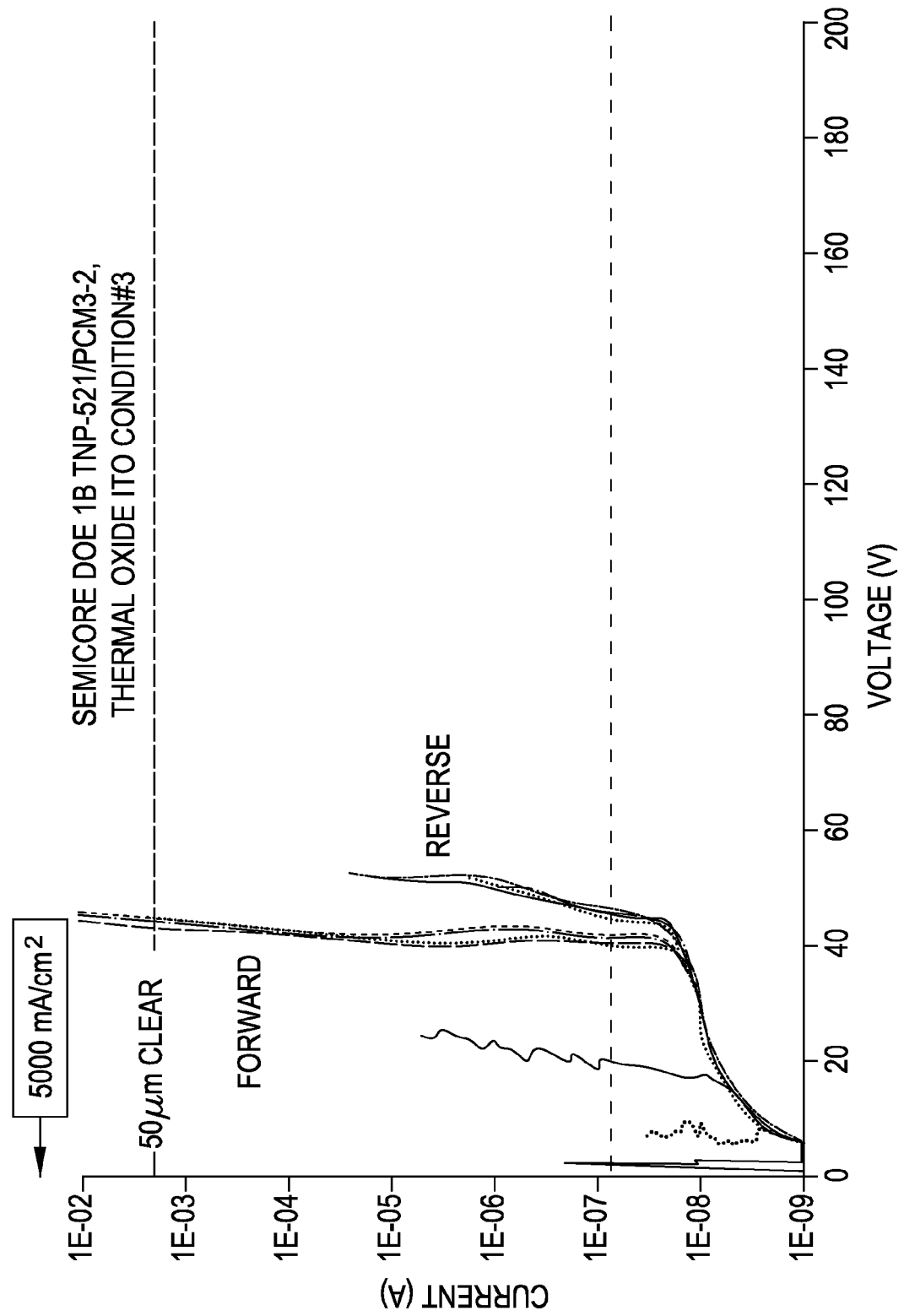
FIG. 11 shows a plot of current voltage characteristics in forward and reverse directions for ITO on 50 nm thermally grown $SiO_2$.

One material initially tested as stopper layer structure 40 was a single layer of silicon dioxide, e.g. ~50 nm thermally grown silicon dioxide. FIG. 11 shows a plot of current voltage characteristics in forward and reverse directions for ITO on 50 nm thermally grown $SiO_2$ illustrating hat current densities exceeding 5000 mA/cm² can be achieved. Silicon dioxide also meets the requirement of being chemically inert with respect to ITO, and having relatively low diffusion coefficients for Indium and Tin. However, charging effects are observed as negative resistance at low voltage. Thus electrical properties of $SiO_2$ are not ideal in the stopper layer structures 40 because $SiO_2$ lends itself to charging effects, despite having achieved very high current densities. Silicon nitride is therefore preferred, as having potentially better electrical transport properties for use in the stopper layer structures 40.

For example, when the emitter layer stack structure (EL structure) 20 as shown in FIG. 4 comprises a multilayer stack of layer pairs comprising emissive layers 12 alternating with respective drift layers 13 similar to those in FIG. 2, in one preferred embodiment, the emissive layers 12 comprise rare earth (RE) doped silicon dioxide, with intervening drift layers 13 comprising silicon dioxide drift layers. The drift layers 13 may be configured for AC or DC operation, i.e. if the device is configured for AC operation, typically the top and bottom layers of the emitter layer stack 20 will be drift layers 13. In this embodiment, the stopper layer structure 40, between the TCO layer 21 and the emitter structure 20, comprises a single layer, preferably comprising a layer of high quality silicon nitride of a suitable thickness, deposited by LPCVD. The single stopper layer 40, comprising 20 nm to 30 nm of LPCVD silicon nitride, was found to provide excellent improvement in TCO reliability and reduce hot electron effects through an increase in the breakdown current density threshold. A single stopper layer 40 from about 5 nm to 50 nm may be appropriate In structures tested, single stopper layers 40 from about 20 nm to 30 nm were found to provide improvements over thinner layers without significantly compromising other aspects of performance. Thicker stopper layers 40 may be used if sufficiently transparent, and if they do not otherwise interfere with device operation. Silicon nitride $Si_3N_4$ is particularly suitable as a stopper layer 40 because it is transparent in the visible range, can be deposited as a stoichiometric layer with very high quality (low trap density) by LPCVD, and has high breakdown strength of >4 MV/cm, and preferably >6 MV/cm and relative permittivity greater than 7. In addition, the conduction process in silicon nitride is through Poole-Frenkel conduction which cools electrons through a trapping and field emission process. A similar stopper layer 40 of 20 nm to 30 nm of high quality PECVD silicon nitride may also be suitable.

Alternative materials for the hot electron stopper layer 40 must provide for hot electrons to lose their energy through an appropriate process, e.g. by impact ionization, i.e. the incident hot electron collides with atoms of the stopper layer material and creates an electron hole pair, thereby losing kinetic energy to the stopper layer material. Materials that have high impact ionization rates allow for the stopper layer 40 to be made as thin as possible. The material must be otherwise compatible with operation of the EL device 100.

Suitable materials for the electron stopper layer structure 40 are transparent at wavelengths to be emitted from the device 100. That is, for visible wavelengths, the material exhibits a large band gap greater than 3 eV, for example in the range 3 eV to 5 eV, to ensure low loss transmission of visible light. Based on impact ionisation rates (see FIG. 12), other materials that have an appropriate bandgap, and may be preferred materials for use as a stopper layer structure 40 are silicon carbide (SiC), thin film diamond (C), and gallium nitride (GaN), both wurtzite and zinc blende phases. These materials may be deposited by any suitable method compatible with fabrication of the other layers of the EL device 100. Diamond has a band gap of 5.5 eV and SiC has a bandgap of 3.2 eV.

The relative permittivity of the stopper layer structure 40 should be higher than that of the (adjacent) drift layer 13 to ensure a reduction of the applied electric field. Beneficially, the relative dielectric permittivity of the stopper layer 40 should be as large as possible (>3.5, and preferably >7) so as to reduce the electric field impinging on the interface of the TCO 21.

The breakdown field strength is desirably above 4 MV/cm and preferably greater than 6 MV/cm. These values typically require materials deposited by a process that provides a high quality layer, with low trap density.

Another suitable stopper layer material is alumina. For this material, the thickness of the stopper layer structure 40 must be determined to allow for cooling due to the reduction in electric field through the ratios of the relative dielectric permittivity of the stopper layer structure 40 relative to the top layer of the emitter structure 20 (i.e. the uppermost drift layer 13). In the example above where the drift layer 13 comprises silicon dioxide having a relative permittivity of 3.9, the ratio would be about 2.

Another option for the stopper layer material is to use high quality silicon dioxide doped with a rare earth (such as cerium) with a very high electron absorption cross section; sufficient stopping is provided as long as the atomic concentration is several times greater than the inverse of the product of the layer thickness and the cross section.

Multilayer Stopper Layer Structure.

Figure 5:
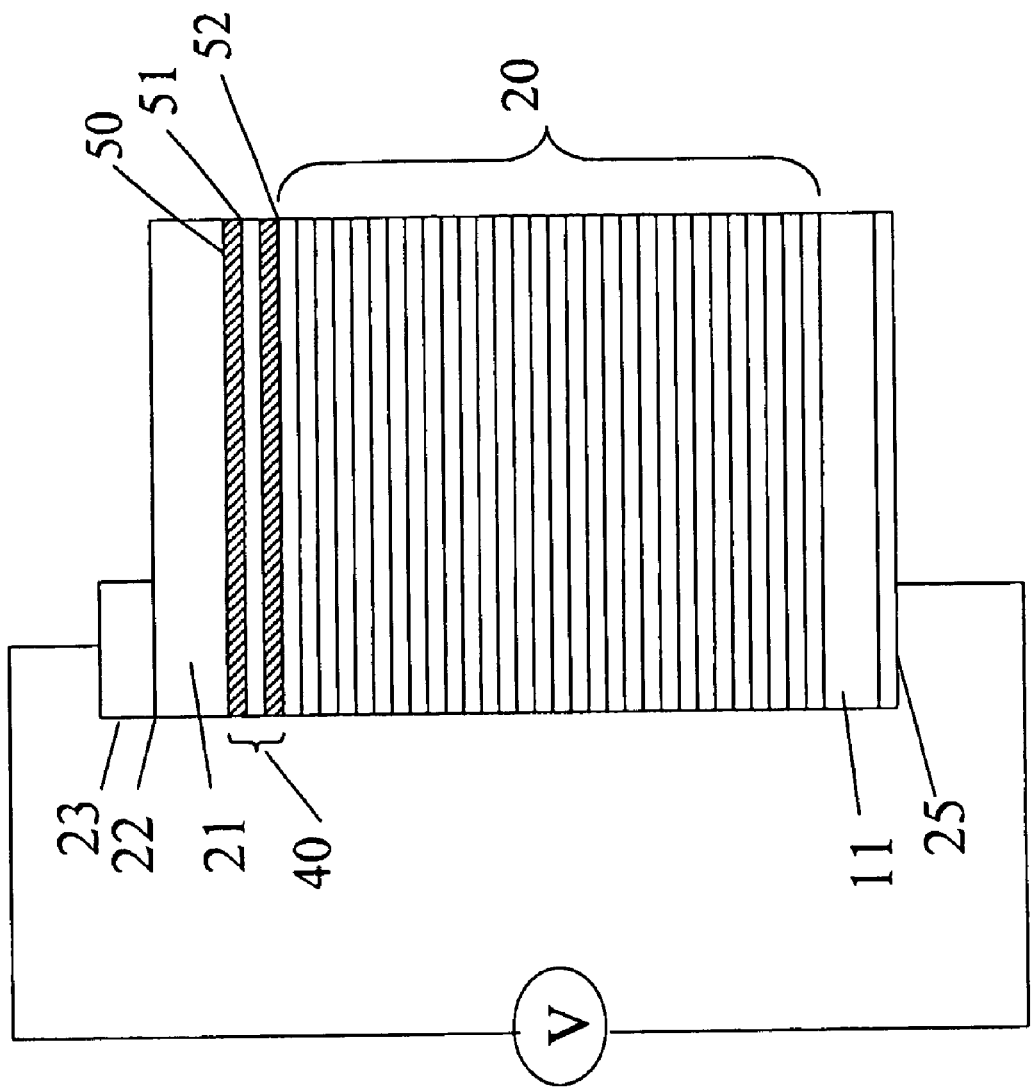
FIG. 5 shows a schematic representation of an electroluminescent device structure comprising a stopper layer structure according to a second embodiment of the present invention.

Alternatively, the stopper layer structure 40 may comprise a multilayer structure 40 as shown in FIG. 5, which illustrates an EL device structure 200 according to a second embodiment of the present invention.

The EL device 200, according to the second embodiment of the present invention, is similar to that in FIG. 4, except that the stopper layer structure 40 comprises, a first barrier layer 50, a stopper layer (second barrier) layer 52, and if required, an adhesion layer 51 therebetween. Multilayer stopper layer structures 40 were explored as alternatives to a layer of silicon dioxide or silicon nitride for high current density applications with significant hot electron flux where a chemical diffusion barrier may also be desirable.

In a preferred embodiment, titanium nitride (TiN) was selected as a first barrier layer 50. TiN a refractory, relatively inert material, and is known for use in forming a diffusion barrier between two layers that should not be intermixed, as between a semiconductor and a metal. Thus the barrier layer 50 of TiN may provide a suitable barrier layer between the TCO electrode layer 21 and a top layer of the emitter structure 20 comprising a wideband gap semiconductor or dielectric, such as $SiO_2$ or silicon rich silicon oxide (SRSO). In practice, to ensure adhesion and compatibility between a layer, such as an oxide forming the top layer of the emitter structure 20, and the barrier layer 50, such as TiN, it is necessary to deposit an adhesion layer 51 under the TiN, e.g. a thin layer of titanium (Ti) on which the TiN has good adhesion, and under that a thin layer of a second barrier layer of an inert material 52, e.g. silicon nitride ($Si_3N_4$), between the top layer of the emitter structure 20 and the adhesion layer 51 to prevent interaction between the titanium in the adhesion layer 51 and the emitter layer structure 20. Thus, in an electroluminescent device 200 according to the second embodiment, a multilayer stopper layer structure 40 is provided comprising the barrier layer 50, the adhesion layer 51 and the second barrier layer 52 respectively of TiN, Ti, $Si_3N_4$. Thus the TiN barrier layer 50 protects the TCO layer 21 from the underlying layers of the emitter structure 20, and the inert, e.g. $Si_3N_4$, layer 52 protects the active layer structure 20 from the Ti adhesion layer 51. The multi-layer stopper layer structure 40 may also function to stop hot electrons as described above.

Other materials that may alternatively be used as a first barrier layer 50 instead of TiN are tantalum nitride (TaN), tungsten nitride ($WN_2$), tantalum carbide (TaC), Other materials which may be used for second barrier layer 52 instead of silicon nitride are boron nitride (BN), aluminum nitride (AlN), silicon carbide (SiC) and thin film diamond (C). If an adhesion layer is required 51, a layer of an appropriate refractory metal is selected, for example.

In considering alternative materials for the multilayer stopper layer structures 40, silicon nitride $Si_3N_4$ is believed to be better candidate than $SiO_2$ for the second barrier layer 52, since it has potentially better electrical transport properties, especially if the layer thickness thin enough to allow quantum mechanical tunnelling i.e. ≦5 nm. The thicknesses of the adhesion layer, e.g. titanium, layer 51 and the first barrier layer, e.g. titanium nitride, layers 50 are preferably also relatively thin, i.e. ~10 nm or less, to maintain acceptable optical transmissivity in the visible region.

The descriptions above are related to a forward-biased structure, i.e. electrons traveling in the direction from the back contact 25 to the TCO layer 21.

In reverse bias or during AC operation, i.e. electrons injected from the ITO layer 21 and received by the substrate 11, e.g. N+ silicon, poorer current-voltage (IV) characteristics are observed, potentially due to roughness at the interface, in addition to a higher electron affinity, between the TCO 21 with the underlying active layer structure 20, leading to field enhanced emission and premature breakdown. It is also possible that non-uniformity of the ITO alloy and its constituents will cause "hotspots" at the injector interface, e.g. metallic field emitter tips where In and Sn have locally separated. Interposing a thin, e.g. 3 to 10 nm, barrier layer 50 of electrically conductive and chemically inert material (i.e. that is not prone to chemical or phase decomposition) may reduce the number of hotspots. To maintain acceptable optical transmissivity in the visible spectrum, the thickness of the TiN barrier layer 50 is preferably limited to 10 nm or less.

The multilayer stopper layer structure 40 as described above may simultaneously improve both the forward and reverse IV characteristics of the emitter device 200, enabling operation to current densities in excess of 5000 mA/cm².

In an EL device 300 according to other embodiments of the present invention, to reduce charging effects and hot electron effects within the emitter structure, a stopper layer structure 40, comprising a plurality of stopper layers 16 may also be provided within the emitter structure 20, adjacent an emissive layer 12 as will now be described.

Figure 6:
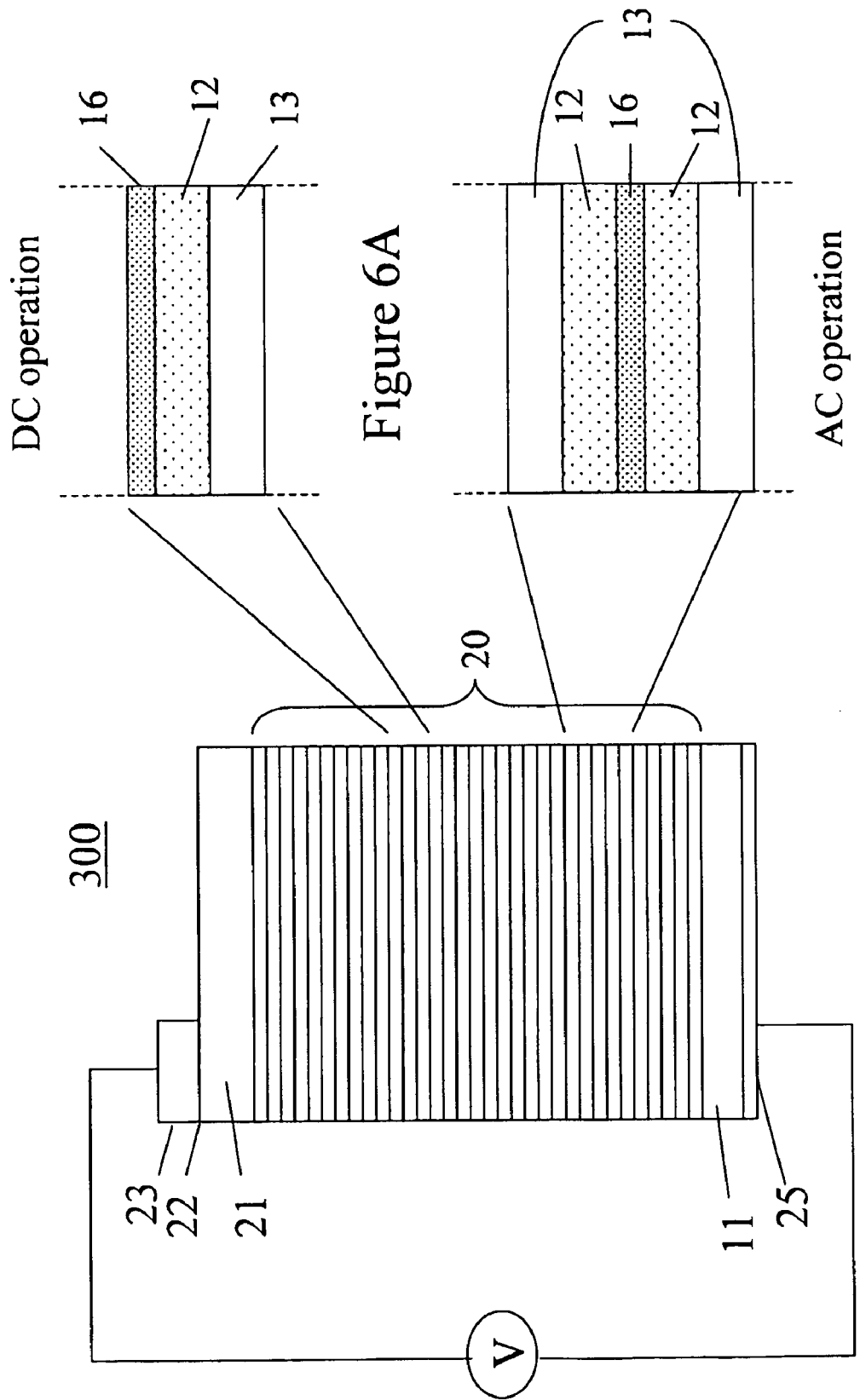

EL Devices Incorporating a Stopper Layer Structure within Emitter Structure:

The EL device 300 according to a third and fourth embodiments of the present invention is shown in FIGS. 6, 6A and 6B. In this embodiment, a stopper layer structure 40 comprises a plurality of layers 16 provided within the emitter layer structure 20. As shown in FIG. 6, the top and bottom electrodes 21 and 25, active layers 12 and drift layers 13 are similar to those in the previously described embodiments (FIGS. 4 and 5), except that a instead of a stopper layer structure comprising single stopper layer 40 (first stopper layer) under the transparent electrode, the stopper layer structure comprises stopper layers 16 (second stopper layers) provided within the emitter layer stack 20, adjacent each active layer 12. That is, each active layer 12 of the emitter structure 20 is disposed between a respective drift layer 13 and a stopper layer 16 as shown in FIG. 6A (for DC operation with the device biased for electron travel from the bottom electrode 25 to the top electrode 21). As shown in FIG. 6B (for AC operation) a stopper layer 16 is sandwiched between two active layers 12, with drift layers 13 on each side.

When an electric field is applied across the substrate 11 (or bottom contact 25) and the TCO top contact 21, and above a threshold electric field, electron current starts to flow from the substrate 11 towards the top TCO contact 21. The electrons are accelerated across the drift regions 13 where they acquire sufficient energy to excite the optical centers in the emissive layer 12 immediately after the drift region 13. Any electrons that do not impart their kinetic energy to the optical centers will still be hot and immediately run into the stopper layers 16, in which carrier generation per unit length is preferably >1E6 pairs/cm, whereby they undergo impact ionization and lose their kinetic energy to the stopper layer 16 and cool. The primary electrons and the carriers generated by impact ionization increase the conductivity of the stopping layers 16 that will result in a reduction of the voltage drop across the individual stopper layers 16 and an increase in the power efficiency of the device structure 300. Once cooled, the electron is once again accelerated by the electric field n the next drift layer 13, and increase in energy back up to substantially the same level at or above an activation energy of the emissive layer 12, but below a threshold level, at which damage occurs to the various other layers, e.g. TCO layer 21, bottom contact 25 and substrate 11. The process repeats until the electron exits the emitter structure 20 at the top TCO contact 21. An additional benefit of this structure is that the electron must pass through a stopper layer 16 adjacent the TCO layer 21 (similar to layer 40 in the first embodiment), before entering the TCO layer 21 ensuring that it has cooled enough to avoid any damage by hot electrons to the TCO layer 21.

Figures 7, 7A:
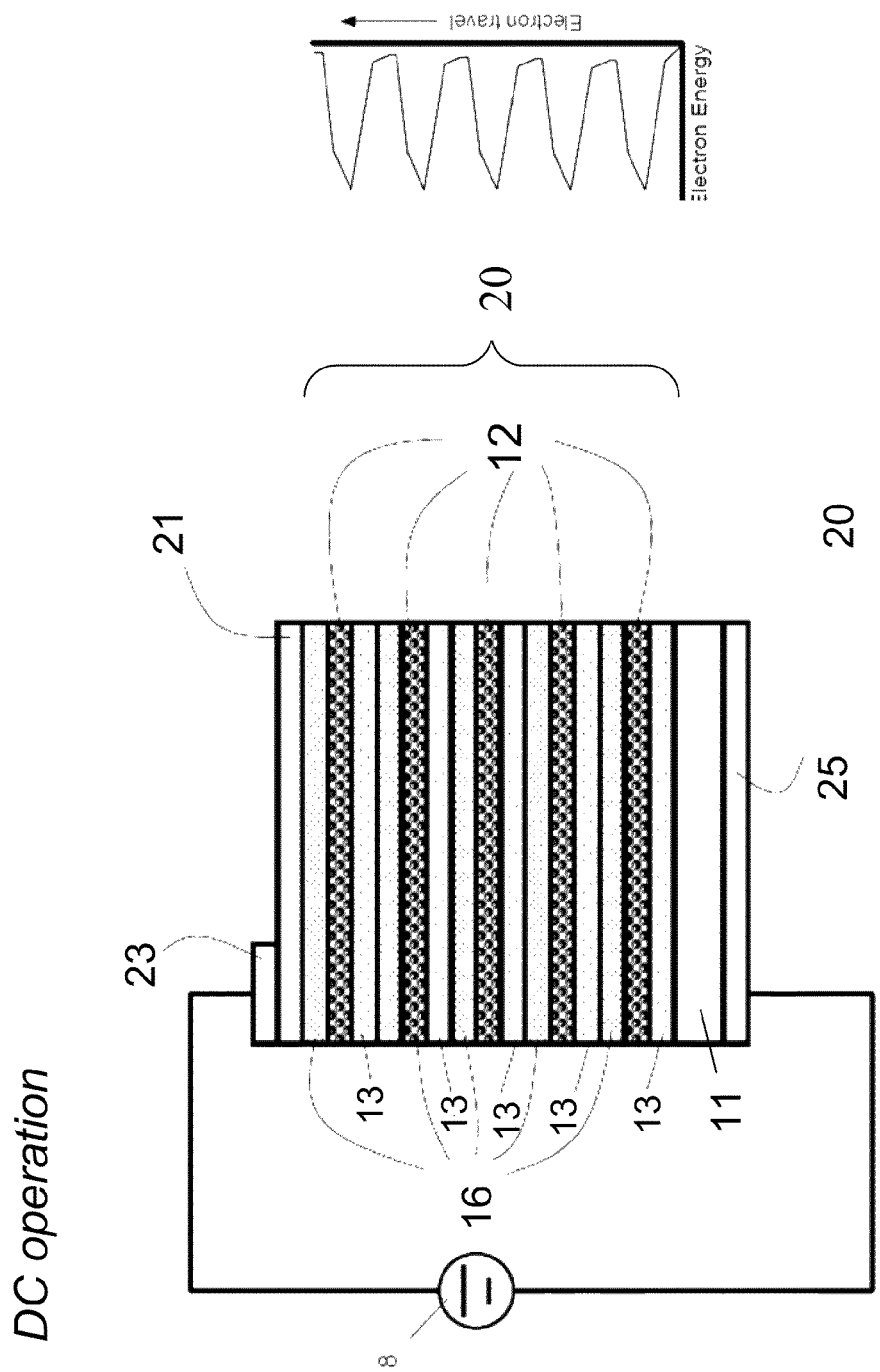
FIG. 7 shows a schematic representation of part of an electroluminescent device comprising a stopper layer structure within the EL structures according to a third embodiment of the present invention.
FIG. 7A represents electron energy as a function of electron travel.

Thus, in a device according to a third embodiment as shown in FIG. 7, comprising a plurality of layer stacks as shown in FIG. 6A, arranged for DC operation 8, the electron energy is effectively managed by a plurality of stopper layers 16 adjacent each emissive layer 12 within the active layer structure 20, to reduce generation of hot electrons. In this embodiment, the top stopper layer 16 also protects the top TCO electrode 21, similar to the stopper layer structure 40 in the embodiments shown in FIGS. 4 and 5.

Figure 8:
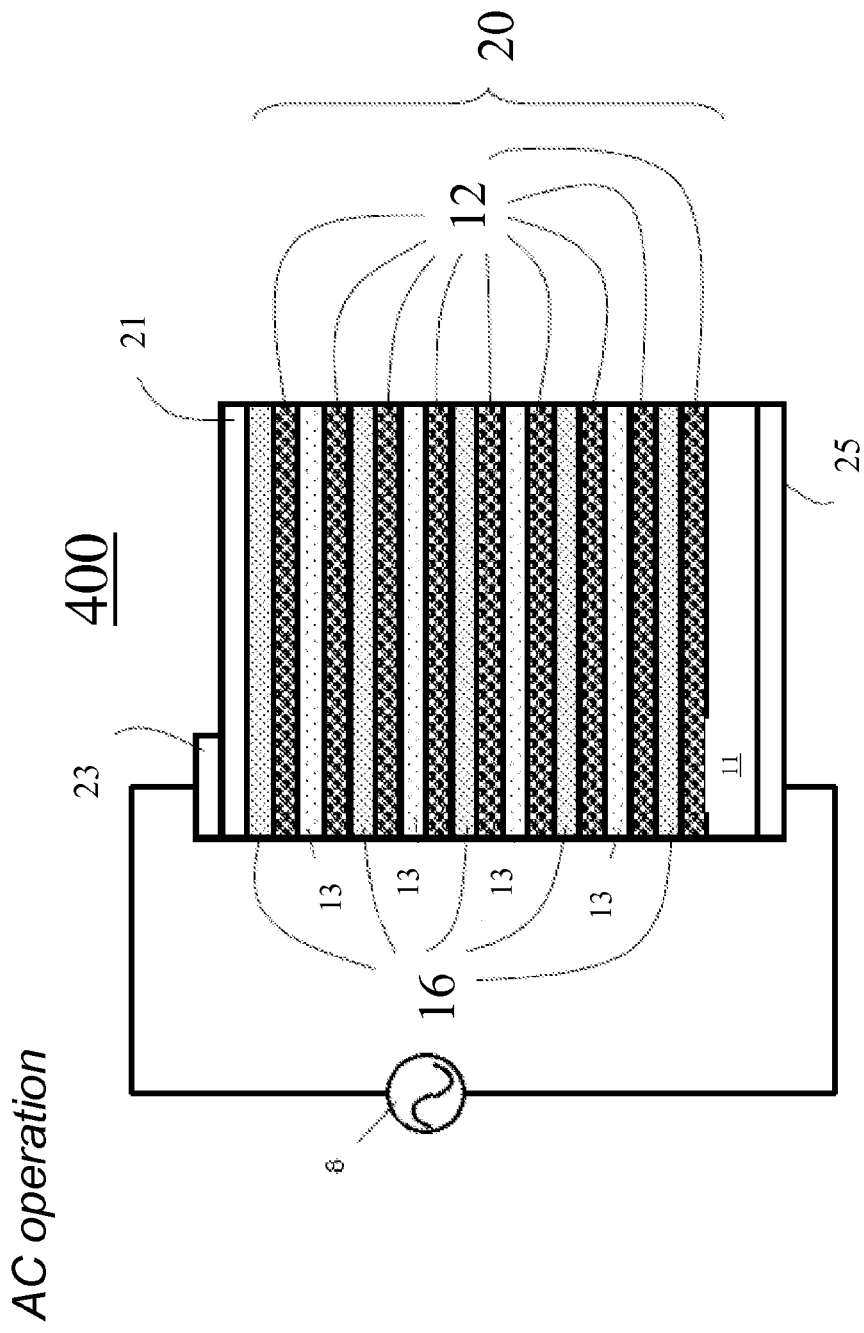
FIG. 8 shows a schematic representation of an electroluminescent device according to a fourth embodiment of the present invention.

An EL device structure 400 according to a fourth embodiment is shown in FIG. 8, which is similar to that shown in FIG. 7, except that it is configured for AC operation 8. Consequently, in this arrangement, an electron stopper layer 16 is sandwiched between two active layers 12, so that electrons are accelerated in a drift layers 13, to excite respective active layer 12, and are stopped by the stopper layer 16 during both forward and reverse voltage cycles In the structures shown in FIGS. 7 and 8, thin stopper layers 16 of amorphous silicon or alumina were deposited using PECVD and sputtering techniques. When the stopper layer structure 40 comprises multiple stopper layers 16 provided within the active region 20, these layers 16 are preferably relatively thin, so as to be substantially transparent to light emitted by the active layers 12.

Requirements for the stopper layers 16 within the emitter structure 20 are otherwise similar to those for the stopper layer structure 40 described with respect to the previously described embodiments. The stopper layer 16 should include a wide band gap sufficient to allow the efficient transmission of visible light generated in the underlying emissive layers 12. The mechanism by which energetic or hot electrons are preferentially cooled needs to be efficient so that damage to the TCO contact 21 is avoided with a minimum in stopper layer thickness, while having a large breakdown field strength (>4 MV/cm, preferably >6 MV/cm) compatible with EL device operation. The relative dielectric permittivity of the stopper layers 16 should be as large as possible (>3.5, preferably >7).

The thickness of the stopper layers 16 will depend on the expected incident electron energy and for the case of silicon how much absorption of generated visible light can be tolerated, as this will directly affect the operating efficiency. An amorphous silicon stopper layer 16 having a thickness from 2 nm to 10 nm was found to be effective in limiting hot electrons in the structures shown in FIG. 7 or 8. Nevertheless, silicon does absorb in the visible region, and other materials with lower absorption in the visible region may be preferred if they can be deposited by a process compatible with deposition of the drift layers 13 and active layers 12.

For semiconductors exploiting impact ionization rates as shown in FIG. 12, the principle of operation is as follows. Hot electrons that have been created in the underlying emissive layer 12 impinge on the stopper layer 16. These hot electrons immediately collide with the atoms, e.g. silicon, in the stopper layer 16 and lose energy to this layer through impact ionization and are cooled. The primary electrons and the carriers generated by impact ionization increase the conductivity of the stopping layer 16 resulting in a reduction of the voltage drop and electric field across the stopper layer 16. After cooling in the stopper layer 16, the electrons are able to continue on into the top TCO layer 21 without causing any significant damage to the TCO layer 21 themselves. As mentioned above, the one drawback of silicon is the optical absorption of visible light, due the rather small band gap of 1.2 eV. This will determine the maximum thickness of the solid silicon stopper layer 16 and the degree of cooling of the incident hot electrons. For the other semiconductor materials indicated in FIG. 12, the effectiveness of a stopper layer 16 should be increased relative to silicon, as the ionization rates are greater that that for silicon at modest electric fields. In particular the ionization rates for diamond are two orders of magnitude larger than for silicon at electric fields greater than 6 MV/cm.

Primary electrons and carriers generated by impact ionisation will increase the conductivity of the stopper layers 16 that results in a voltage drop across the individual stopper layer 16 and an increase in power efficiency of the device structure. Once cooled an electron is again accelerated in the electric field in the next drift layer 13.

If the stopper layer 16 is made from a thin layer of alumina, the mechanism for cooling down the electrons is simply through a reduction in the electric field. The relative dielectric constant for alumina is reported to be 8 to 9 (James Kolodzey et al., "Electrical Conduction and Dielectric Breakdown in Aluminum Oxide Insulators on Silicon", IEEE Trans. Electron Device 47, 121-127 (2000)). Given that the relative dielectric permittivity of wide band gap dielectrics such as silicon dioxide and silicon nitride are 3.9 and 7 respectively (S. M. Sze, "Physics of Semiconductor Devices", pg. 850-852 Wiley-Interscience, New York), the electric field in the alumina will be reduced by a factor greater than 2 if the emissive layer matrix is composed of silicon oxide for example. The conduction mechanism in alumina appears to be Poole-Frenkel in the electric field range of 2 MV/cm. The breakdown electric fields for alumina are in the 4 MV/cm to 5 MV/cm range so there is potential for cooling of hot electrons in an alumina stopper layer with suitable thickness.

In typical device structures described above, active layers 12 comprising RE doped silicon dioxide may have a thickness of ~1 nm to ~10 nm. For operation of the device using electric fields in the range from 5 MV/cm to 10 MV/cm, the thickness of the corresponding drift layers would be in the order of ~2 nm to 9 nm. A suitable thicknesses of the stopper layer 40 provided by a single layer of silicon nitride as in the second embodiment, would be relatively thick, ~20 nm to ~30 nm. However the thickness of stopper layers 16 disposed within in the emitter stack, i.e. adjacent active layers 12 or within active layers 12 would typically need to be thinner, e.g. not more than ~2 nm to 10 nm, to avoid increasing the thickness of the emitter structure stack 20 significantly, and requiring an increase in applied voltage to maintain operating conditions.

Consequently, although a layer of amorphous silicon was tested for effect, using silicon stopper layers 16 having a thickness of 2 nm to 10 nm within the emitter structure 20, silicon stopper layers 16 are not ideal for practical reasons in a multilayer structure, because silicon does absorb light in the visible region. Consequently for applications requiring high brightness, e.g. solid state lighting, alternative materials such as thin film diamond, may be preferred.

Figure 9:
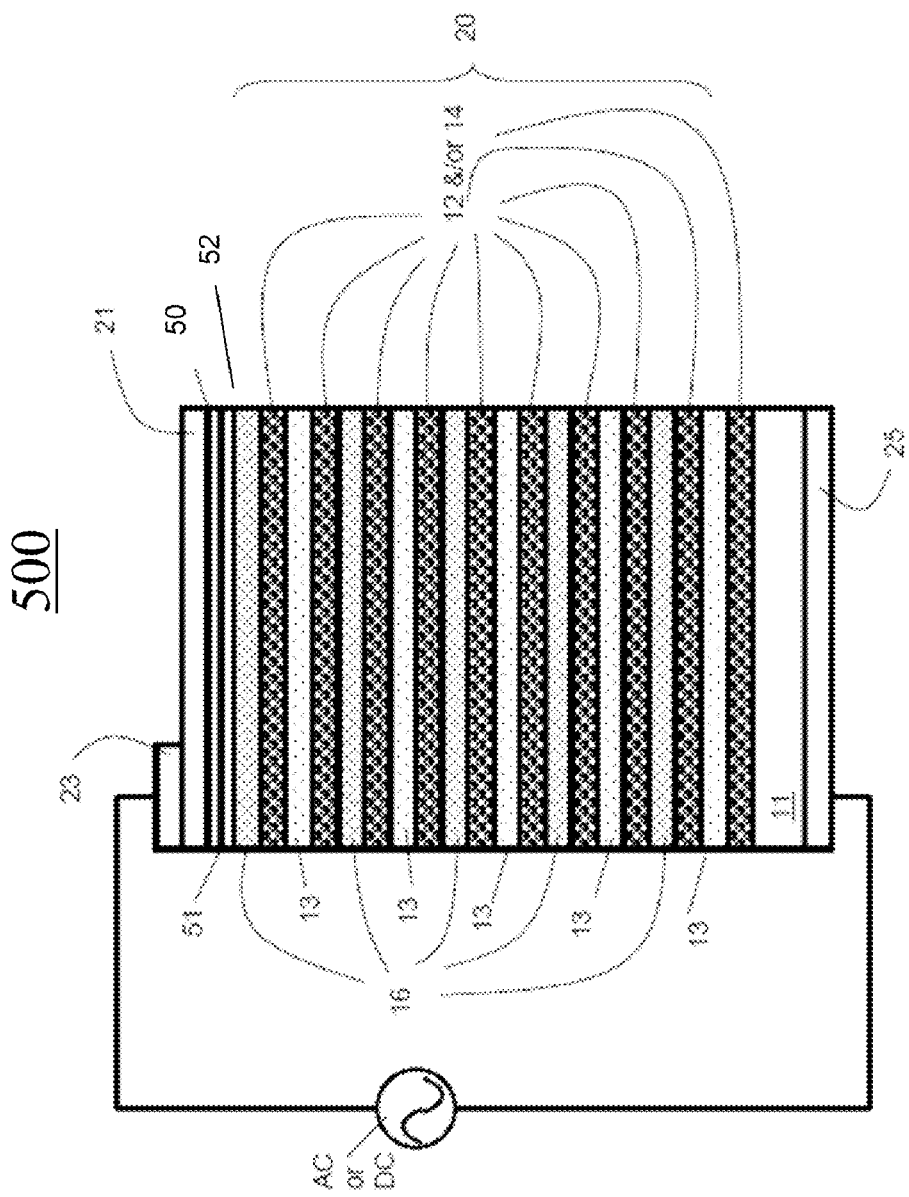
FIG. 9 shows a schematic representation of an electroluminescent device according to a fifth embodiment of the present invention.

Another embodiment of the invention is shown in FIG. 9. In this embodiment 500, which is configured for AC operation, in order to limit the energy of electrons to a desired maximum value required for efficient excitation of the optical emissive centers in the light emitting structure 20, a stopper layer structure 40 comprising a series of stopper layers 16 are provided within the emitter structure 20, similar to the fourth embodiment described above, and in addition, the stopper layer structure 40 also comprises barrier layers 50, 51 and 52 as described above, placed between the upper TCO electrode 21 and the top layer of the active layer structure 20. Stopper layers 16 are provided between the active layers 12 to stop (or at least slow down) electrons and limit any possibility for subsequent cascading of energy build up. As described above, a thin layer of material, e.g. silicon, or other suitable material, may be used as the stopper layer 16. An emissive layer 12 or 14 is provided on either side of each stopper layer 16 so as to generate photons regardless of the direction of travel of the energetic electrons that would result from an alternating current bias as described with reference to FIG. 8. The active layer structure 20 can comprise active layers 12, which include first luminescent centers for emitting light at a first wavelength, and active layers 14, which include second luminescent centers for emitting light at a second wavelength different from the first. The combination of the first and second wavelengths can generate other colors, e.g. visible white light, as desired.

In this embodiment, at the substrate 11, there is no need for a drift layer 16 between the substrate 11 and the first emissive layer 12, because a drift layer 13 would only serve to accelerate electrons traveling towards the substrate 11 into the substrate 11, when biased from the TCO layer 21 to the substrate 11. For a bias in the other direction, whereby electrons are traveling from the substrate 11 towards the TCO electrode 21, a drift layer 13 adjacent to the substrate 11 would serve a useful purpose. However, by placing an emissive layer 12 adjacent to the injecting interfaces, i.e. adjacent to the substrate 11 as shown in FIG. 9, electron energy may have been reduced by the emissive layer 12 prior to interacting with the injecting interfaces. In variations of this structure, a stopper layer 16 may be included immediately above the substrate 11; or a drift layer (13) may be placed below the lowermost emissive layer (12) and above the topmost emissive layer for AC operation.

The EL devices in the embodiments described above and shown schematically in FIGS. 2 to 9 are described by way of example only. In practice, EL devices of other embodiments may comprise a single layer or multilayer stopper layer structure 40 as described with reference to the embodiments above, in combination one or more other device features, such as those described in the above mentioned copending US patent applications, and in co-pending U.S. patent application Ser. No. 61/084,666 filed Jul. 30, 2008 entitled "Injector Layer for Electrode of Light Emitting Devices" and U.S. Ser. No. 61/083,673 filed Jul. 25, 2008 entitled "Injector Layer Structure for a Light Emitting Device"; and US Patent Application No. 2007/0181898 published Aug. 9, 2007 entitled "Pixel Structure for a Solid State Light Emitting Device".

Figure 10:
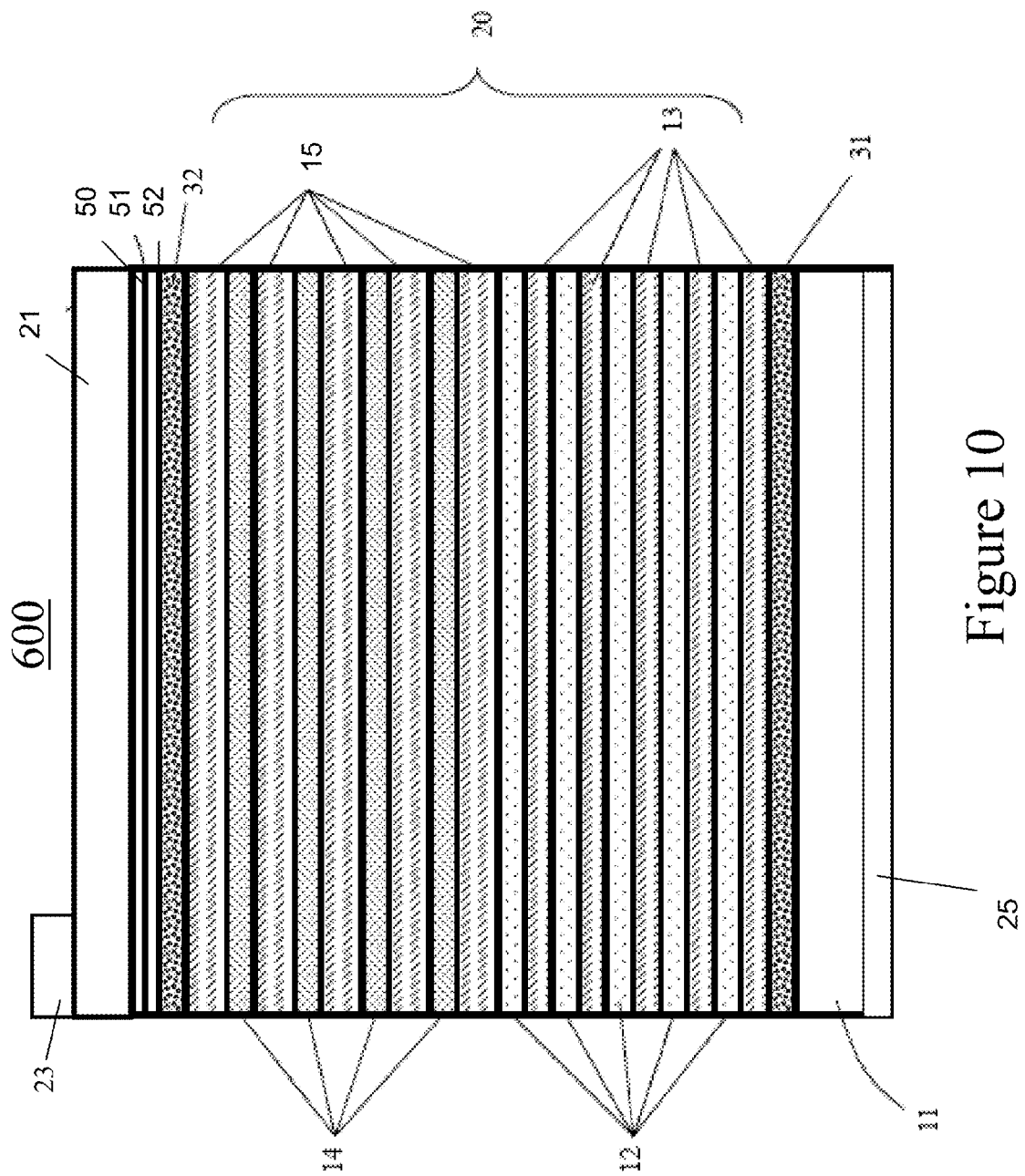
FIG. 10 shows a schematic representation of an electroluminescent device according to a sixth embodiment of the present invention.

Thus for example as shown in FIG. 10, an light emitting device 600 comprises an EL emitter structure 20 which is described below, a multilayer stopper layer structure 40 comprising layers 50,51 and 52 similar to those of the embodiments shown in FIG. 5 or FIG. 9, and device structure also comprises transition layers 31 and 32. The emitter structure 20 in this embodiment comprises multiple active layers 12 and 14 each comprising luminescent centers in a host matrix activated by impact ionization or impact excitation, e.g. an alumina ($Al_2O_3$) or silica ($SiO_2$) film doped with rare earths, or rare earth oxides, or SRSO or SRSN with or without RE doping. Respective drift layers (buffer layers) 13 and 15 are provided by a wide bandgap semiconductor or dielectric material. Each layer 12, 14, 13, and 15 has an independently selected composition and thickness.

Each of the active layers 12 and 14 typically has a thickness of from ~1 nm to ~10 nm. The thicknesses of active layers 12 and 14 are typically determined empirically based on a trade-off between the energy requirements and the brightness of the light. The thicker the active layer 12 or 14 is, the brighter the layer can be, since there would be more luminescent centers per sq. mm; however, the excitation energy will not be optimum throughout the entire thickness so there will be a loss of efficiency. On the one hand, if the active layer 12 or 14 is infinitely thin then the energy would be precisely known for the whole layer and therefore energy matching could be optimized. However, if the active layer 12 or 14 were infinitely thin, there would be no luminescent centers and no light. Each of the active layers 12 and 14 can comprise the same or different luminescent species, e.g. rare earth doping elements, for generating the same or different wavelength of light, e.g. all of the active layers 12 emit one wavelength and all of the active layers 14 emit a second wavelength. By using active layers 12 and 14 having different compositions, a structure 20 can be prepared which emits light of different colours, which may be combined to provide a light of a desired spectrum or color rendering index (CRI). For example, by combining in a single structure multiple layers doped with terbium, cerium and europium, (preferably <5 at %), which respectively emit in the green (terbium), blue (cerium), and red (europium) region of the spectrum, the light emitting device structure may provide white light of a desired CRI. Other suitable rare earth elements include one or more of the lanthanides, i.e. cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), and preferably one or more of Ce, Eu, Gd, Tb, or Tm.

Drift layers 13 and 15 comprise materials such as undoped aluminum oxide, silicon dioxide or other suitable insulating layers, or dielectric or widebandgap semiconductor, which separate the active layers 12 and 14. The transparent current injection layer 21 is deposited on top of the multi-layer structure 20.

The thickness of the drift layers 13 are determined as a function of the emission wavelength, and therefore of the required excitation energy of the corresponding active layers 12 and 14. For an electric field applied perpendicular to the plane of the layers 12 to 14, an electron must gain sufficient energy from the applied electrical field to excite the luminescent centers to the correct energy, i.e. the energy gained in the drift layers 13 (measured in eV) is equal to the electric field multiplied by the thickness of the drift layer 13 or 15. Accordingly, the drift layers 13 between active layers 12 may have a different thickness than the drift layers 15 between the active layers 14. Typically the applied electric field will be from about 3 MV/cm to about 10 MV/cm dependent on layer thicknesses and available voltage of the applied electric field, although at least 5 MV/cm may be preferred for visible light generation. For example, for an applied electrical field of 5 MV/cm, the thickness of the drift layer 13 or 15 must be 3.8 nm or thicker to excite a luminescent center to 1.9 eV (1.9 eV/0.5 eV/nm=3.8 nm), 4.6 nm or thicker to excite a luminescent center to 2.3 eV, or 5.6 nm or thicker to excite a luminescent center to 2.8 eV.

For the light emitting device 600, illustrated in FIG. 10, comprising a multi-layered light emitting film structure 20 powered by AC electrical power, in which neighboring active layers, e.g. 12 and 14, emit at different wavelengths, the intervening drift layer, e.g. 15, must be thick enough to excite the luminescent centers in the higher energy active layer 12 or 14.

Depending on the number of active layer/drift layer pairs, typically the resulting multilayer emitter structure 20 has a total thickness of from 50 nm to 2000 nm, although a thickness of from 150 nm to 750 nm may be preferred, depending upon the available amount of voltage for powering the device.

As described above if device structure 600, or other light emitting device structure according to embodiments of the invention is fabricated on a substrate 11 comprising thick field oxide (FOX) regions 28 (as shown in FIG. 3) is advantageous in producing a device that is more efficient than a simple planar device. The field oxide regions 28 provide a barrier to vertical current flow and current injection is confined within the device well region 27. Metal interconnects and contacts 22 and 23 are placed over the thick field oxide region 28 to avoid blocking light emission from the device well region 27.

When using AC bias, displacement current associated with the device capacitance may be reduced by placing the metal and contacts 23 over the field oxide layers 28 to reduce the parasitic capacitance. As the field oxide layers 28 are relatively very thick, e.g. 2 to 10 times, preferably 4 to 6 times, but 10 to 50 times and even up to 100 times is possible, relative to the optically active, e.g. emitter layer structure 20, the field oxide capacitance per unit area, CFOX, is significantly smaller than that of the emitter layer structure 20. Accordingly, since the total capacitance is simply the parallel combination of CFOX and the capacitance of the emitter layer structure 20 in the device well region 27, the field oxide structure results in a reduction of the total device capacitance and the magnitude of the measured displacement current. Field oxide regions 28 also reduce the parasitic capacitance associated with the metal contacts 23, minimizing the total device capacitance.

In addition to the stopper layer structures 40, which may comprise a single layer 40, optional layer 41, multiple layers 50,51, 52 &/or 16, as described above, the light emitting device structure 20 may also comprise layer structures 31 and 32 at the upper and lower interfaces of multilayer emitter structure 20, i.e. with the substrate 11 and TCO electrode 21, as illustrated in FIG. 10. The layer structures 31 and 32 may provide, e.g. one or more of: injector layer functionality, and transition/set back layer functionality, for example, as described in co-pending U.S. patent application Ser. No. 61/084,666 filed Jul. 30, 2008 "Injector Layer for Electrode of Light Emitting Devices" and U.S. Ser. No. 61/083,673 filed Jul. 25, 2008, "Injector Layer Structure for a Light Emitting Device"; US Patent Application No. 2007/0181898 published Aug. 9, 2007, "Pixel Structure for a Solid State Light Emitting Device", which are incorporated herein by reference.

Alternatively, the transition layers 31 and 32 may be provided by a thin layer of other conductive materials, e.g. metal. The transition layers 31 and 32 significantly increase the injection efficiency of electrons from the contact electrodes 23 into the active layer structure 20 and reduce work function asymmetries through direct tunneling from the contact interfaces, as evidenced by the reduced electric field required for current flow. The transition layers 31 and 32 provide increased resistance to hot electron effects associated with the interfaces, and also provide shielding to the current injection layer 21 and the silicon substrate 11 interfaces from local charge build-up leading to electric field enhanced current injection. Moreover, they serve as set back layers to set the high field regions associated with the optically active region back and away from the contact interfaces. Accordingly, the addition of transition layers 31 and 32 may significantly improve reliability and lifetime of the device 120.

For a 200 nm thick active layer structure 20, the transition layers 31 and 32 are in the order of 5 nm to 20 nm, preferably 8 nm to 12 nm, and most preferably 10 nm, i.e. preferably 2.5% to 10%, more preferably 4% to 6%, and most preferably 5%, of the thickness of the active layer structure 20, would be sufficient to reduce the electrical field at the interfaces significantly. The transition layers 31 and 32 should result in a reduction in the high field trap and interface generation issues as discussed above leading to a more robust and efficient optically active device structure. A stopper layer structure 40 comprising first and second barrier layers 50 and 52, and an intervening adhesion layer 51, as defined above, are also provided to separate and protect the upper TCO electrode 21 from the top layer of the active layer structure 20.

In the embodiments described above, the materials for the single layer or multilayer stopper layer structures 40 (single layer 40, optional layer 41, multiple layers 50,51, 52 &/or stopper layers 16) may be deposited using various suitable techniques, such as, sputtering LPCVD, PECVD, ALE, and MBE, compatible with processing of other layers of the EL device structure.

All patents and patent applications referred to above are herein incorporated by reference.

Although embodiments of the invention have been described and illustrated in detail, it is to be clearly understood that the same is by way of illustration and example only and not to be taken by way of limitation, the scope of the present invention being limited only by the appended claims.

INDUSTRIAL APPLICABILITY

Provision of stopper layer structures in light emitting device comprising electroluminescent structures reduce hot electron effects such as charging and breakdown of TCO electrodes. Beneficially, use of a stopper layer structure to protect TCO electrodes, or within the emitter layer structure provides for electron energy levels maintained between an excitation level of the active layer and a threshold level for damage to the active or electrode layers.

Such structures are beneficial for electroluminescent devices for solid state lighting applications operating under higher fields and electron fluxes to reduce hot electron related effects, and improving charge to breakdown and reliability of TCO electrode structures.

The invention claimed is:

1. A light emitting structure comprising:
   an electroluminescent emitter layer structure (EL structure) comprising at least one active layer containing luminescent centers and a respective drift layer adjacent each active layer;
   first and second electrode layers disposed on opposite sides of the electroluminescent emitter layer structure for applying an electric field thereto for excitation of light emission from the luminescent centers; and at least one stopper layer for dissipating hot electron energy through impact ionization disposed between layers of the EL structure and one of the first and second electrode layers; and wherein the at least one stopper layer is selected from the group consisting of semiconductors and dielectrics having at least one of an impact ionization rate and a relative dielectric permittivity greater than that of adjacent layers of the EL structure.

2. A light emitting structure according to claim 1, wherein the first electrode layer is a transparent electrode layer comprising a transparent conducting material, and wherein the at least one stopper layer comprises a first stopper layer between the EL structure and the transparent electrode layer.

3. A light emitting structure according to claim 2, wherein the first stopper layer has a thickness sufficient to dissipate hot electron energy above a damage threshold energy of the transparent electrode layer.

4. A light emitting structure according to claim 2, wherein the transparent electrode layer comprises a transparent conducting oxide (TCO), and wherein the first stopper layer has a bandgap greater than 3 eV.

5. A light emitting structure according to claim 2, wherein the EL structure comprises: a plurality of active layers, each active layer comprising a dielectric or wide bandgap semiconductor including luminescent centers, and a plurality of respective drift layers, each drift layer comprising a dielectric or wide bandgap semiconductor.

6. A light emitting structure according to claim 5, wherein the EL structure comprises: a plurality of active layers, each active layer comprising rare earth doped silicon dioxide, and a plurality of respective drift layers, each drift layer comprising silicon dioxide, wherein the transparent electrode layer comprises a transparent conductive oxide, and wherein the first stopper layer is interposed between a top drift layer of the EL structure and the transparent electrode layer.

7. A light emitting structure according to claim 5, wherein the at least one stopper layer further comprises a plurality of second stopper layers within the EL structure, and wherein one of said second stopper layers is disposed between consecutive active layers.

8. A light emitting structure according to claim 7, wherein the first and second electrode layers generate an electric field producing an alternating current; and wherein the EL structure comprises one of the second stopper layers between active layers, with buffer layers on outer sides of the active layers.

9. A light emitting structure according to claim 7, wherein the first and second electrodes generate an electric field producing a direct current; and wherein the EL structure comprises one of the second stopper layers adjacent one of the active layers on one side thereof and adjacent one of the buffer layers on the other side thereof.

10. A light emitting structure according to claim 7, wherein each second stopper layer comprises silicon.

11. A light emitting structure according to claim 7, wherein each active layer comprises a layer of rare earth doped silicon dioxide of thickness from 1 nm to 10 nm, and each drift layer comprises a layer of silicon dioxide of thickness from 3 nm to 10 nm, and wherein each second stopper layer has a thickness of 2 nm to 10 nm.

12. A light emitting structure according to claim 2, further comprising a barrier layer disposed between the first stopper layer and the transparent electrode layer, the barrier layer comprising a material which is electrically conductive and substantially chemically inert with respect to the transparent electrode layer.

13. A light emitting structure according to claim 12, wherein the barrier layer (52) comprises one of a refractory metal nitride and a refractory metal carbide, and further comprising an adhesion layer (51) between the first stopper layer and the barrier layer (50,52).

14. A light emitting structure according to claim 12, wherein the barrier layer comprises a material selected from the group consisting of titanium nitride (TiN), tantalum nitride (TaN), tungsten nitride (WN2), and tantalum carbide (TaC).

15. A light emitting structure according to claim 12, wherein the barrier layer has a thickness of from 3 nm to 30 nm.

16. A light emitting structure according to claim 2, wherein the first stopper layer has a thickness in the range from 5 nm to 50 nm.

17. A light emitting structure according to claim 2, wherein the first stopper layer has a thickness in the range from 20 nm to 30 nm.

18. A light emitting structure according to claim 1, wherein the EL structure further comprising transition layers (31,32) between a top layer of the EL structure and the first electrode layer and between a bottom layer of the EL structure and the second electrode layer.

19. A light emitting structure according to claim 1, wherein each stopper layer has an impact ionization rate providing carrier generation per unit length of greater than $10^6$ pairs per cm.

20. A light emitting structure according to claim 1, wherein each stopper layer has a relative dielectric permittivity greater than 3.5.

21. A light emitting structure according to claim 1, wherein each stopper layer has a relative dielectric permittivity of greater than 7.

22. A light emitting structure according to claim 1, wherein each stopper layer comprises silicon nitride.

23. A light emitting structure according to claim 1, wherein each stopper layer comprises cerium doped silicon dioxide.

24. A light emitting structure according to claim 1, wherein each stopper layer comprises alumina.

25. A light emitting structure according to claim 1, wherein each stopper layer comprises a material selected from the group consisting of thin film diamond (C), silicon carbide (SiC), boron nitride (BN), aluminum nitride, and gallium nitride (GaN).

\* \* \* \* \*